United States Patent
Toyoda

(10) Patent No.: US 10,418,479 B2
(45) Date of Patent: Sep. 17, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Yoshiaki Toyoda, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/997,621

(22) Filed: Jun. 4, 2018

(65) Prior Publication Data

US 2018/0366577 A1 Dec. 20, 2018

(30) Foreign Application Priority Data

Jun. 19, 2017 (JP) .................................. 2017-119252

(51) Int. Cl.
*H01L 29/78* (2006.01)
*H01L 29/10* (2006.01)
*H01L 29/66* (2006.01)

(52) U.S. Cl.
CPC ...... *H01L 29/7813* (2013.01); *H01L 29/1095* (2013.01); *H01L 29/66734* (2013.01)

(58) Field of Classification Search
CPC ......... H01L 29/10; H01L 29/66; H01L 29/78; H01L 29/1095; H01L 29/66734; H01L 29/7813; H01L 29/66712; H01L 29/7802; H01L 27/11273; H01L 29/7808
See application file for complete search history.

(56) References Cited

U.S. PATENT DOCUMENTS

| 6,323,518 | B1 | 11/2001 | Sakamoto et al. |
| 2002/0030226 | A1 | 3/2002 | Yasuhara et al. |
| 2006/0006458 | A1* | 1/2006 | Motai ................. H01L 29/0634 257/330 |
| 2006/0197152 | A1* | 9/2006 | Tokano ............... H01L 29/0634 257/341 |
| 2014/0008718 | A1 | 1/2014 | Toyoda |

(Continued)

FOREIGN PATENT DOCUMENTS

| JP | 2000-091344 A | 3/2000 |
| JP | 2009-043966 A | 2/2009 |
| JP | 4488660 B2 | 6/2010 |

(Continued)

*Primary Examiner* — Thanh T Nguyen
(74) *Attorney, Agent, or Firm* — Rabin & Berdo, P.C.

(57) ABSTRACT

A vertical MOSFET is provided in an output stage region of a semiconductor substrate while a lateral n-channel MOSFET and a vertical diode are provided in a circuit region. The vertical diode is constituted by a $p^+$-type diffusion region that penetrates a $p^-$-type well region in a depth direction. A bottom of a first contact trench provided in an $n^+$-type source region of the vertical MOSFET is covered by a $p^{++}$-type contact region. A bottom of a second contact trench provided in an $n^+$-type source region of the lateral n-channel MOSFET is covered by a $p^{++}$-type contact region and a third contact trench provided in an $n^+$-type drain region is covered entirely by the $n^+$-type drain region.

14 Claims, 17 Drawing Sheets

(56) References Cited

U.S. PATENT DOCUMENTS

2016/0254198 A1\* 9/2016 Toyoda ............. H01L 21/82385
438/212

FOREIGN PATENT DOCUMENTS

| JP | 5388495 B2 | 1/2014 |
| JP | 5578165 B2 | 8/2014 |
| JP | 5641131 B2 | 12/2014 |
| JP | 6037085 B2 | 11/2016 |

\* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-119252, filed on Jun. 19, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Power semiconductor devices that include a vertical power semiconductor element and a lateral semiconductor element for a control/protection circuit of the vertical power semiconductor element on a single semiconductor substrate (semiconductor chip) with an aim to increase reliability, and reduce the size and cost of the power semiconductor element are known (for example, refer to Japanese Laid-Open Patent Publication No. 2000-091344, Japanese Patent No. 5641131, Japanese Patent No. 6037085).

A structure of a conventional semiconductor device will be described taking, as an example, a power semiconductor device that includes on a single semiconductor substrate, a vertical n-channel power metal oxide semiconductor field effect transistor (MOSFET) for output and a lateral complementary MOS (CMOS) for a control circuit. FIG. 17 is a cross-sectional view of a structure of a conventional semiconductor device.

The conventional semiconductor device depicted in FIG. 17 is an example of an automotive high-side power integrated circuit (IC) in which a vertical n-channel power MOSFET for an output stage is implemented as vertical MOSFET 110 having a trench gate structure. The conventional semiconductor device depicted in FIG. 17 includes an output stage region 141 and a circuit region 142 on a semiconductor substrate 113. The semiconductor substrate 113 is an epitaxial substrate in which an $n^-$-type semiconductor layer 102 is formed by epitaxial growth on a front surface of an $n^+$-type starting substrate 101.

In the output stage region 141, the vertical MOSFET 110 for the output stage is arranged. In the output stage region 141, the $n^+$-type starting substrate 101 and the $n^-$-type semiconductor layer 102 function as a drain region and a drift region, respectively. A drain electrode (drain terminal) 112 connected to a rear surface (rear surface of the $n^+$-type starting substrate 101) of the semiconductor substrate 113 is a power supply voltage terminal (hereinafter, Vcc terminal) to which an automotive battery is connected.

At a front surface side (side of the $n^-$-type semiconductor layer 102 opposite a side thereof opposing the $n^+$-type starting substrate 101) of the semiconductor substrate 113, a ground terminal (hereinafter, GND terminal) and an output terminal (hereinafter, OUT terminal) are provided. A source electrode (source terminal) 111 of the vertical MOSFET 110 is connected to the OUT terminal. Reference numerals 103 to 109 are respectively a trench, a gate insulating film, a gate electrode, a p-type base region, an $n^+$-type source region, a $p^{++}$-type contact region, and an interlayer insulating film of the vertical MOSFET 110.

In the circuit region 142, a control-circuit lateral CMOS configured to control the vertical MOSFET 110, etc. is arranged. In FIG. 17, of a lateral p-channel MOSFET and a lateral n-channel MOSFET 120 complementary connected and constituting the control-circuit lateral CMOS arranged in the circuit region 142, the lateral n-channel MOSFET 120 alone is depicted. In the circuit region 142, in a surface layer of a front surface of the semiconductor substrate 113, a $p^-$-type well region 121 is selectively provided.

In the $p^-$-type well region 121, an $n^+$-type source region 122, an $n^+$-type drain region 123, and a $p^{++}$-type contact region 124 of the lateral n-channel MOSFET 120 are each selectively provided. The $p^{++}$-type contact region 124 is exposed together with the $n^+$-type source region 122 at a contact hole 109a where a contact (electrical contact) with a source electrode (source terminal) 127 is formed.

Further, in the $p^-$-type well region 121, near an outer periphery of the $p^-$-type well region 121, a $p^+$-type diffusion region 131 is provided separated from the lateral n-channel MOSFET 120. A depth of the $p^+$-type diffusion region 131 is equal to a depth of the $p^-$-type well region 121 or is deeper than the depth of the $p^-$-type well region 121. The $p^+$-type diffusion region 131 functions as an inversion prevention layer that prevents inversion of the $p^-$-type well region 121 by a potential of a wiring layer stacked on the front surface of the semiconductor substrate 113. Further, the $p^+$-type diffusion region 131 functions as an anode region of a vertical diode 130 built in the circuit region 142 for surge protection and described hereinafter.

In the $p^+$-type diffusion region 131, a $p^{++}$-type contact region 132 forming a contact with a wiring layer 133 is selectively provided. FIG. 17 depicts an example of a case in which the lateral n-channel MOSFET 120 is used in various inverter circuits in the control circuit, and a source electrode 127 of the lateral n-channel MOSFET 120 is electrically connected to the GND terminal. The $p^-$-type well region 121 constituting a back gate is also electrically connected to the GND terminal via the $p^{++}$-type contact region 124 and the source electrode 127.

A drain electrode 128 of the lateral n-channel MOSFET 120 is electrically connected to various non-depicted lateral semiconductor elements (lateral p-channel MOSFET constituting the control-circuit lateral CMOS, a resistance element, etc.). Reference numerals 122, 123, 125, and 126 are respectively, an $n^+$-type source region, an $n^+$-type drain region, a gate insulating film, and a gate electrode of the lateral n-channel MOSFET 120. For such an automotive power IC, high surge capability and enhanced performance (low ON resistance, faster switching speed) of the vertical MOSFET 110 for the output stage are demanded.

In the power IC depicted in FIG. 17, to ensure high surge capability between the Vcc terminal and the OUT terminal, the surge capability of the vertical MOSFET 110 for the output stage has to be increased. Conventionally, as a contact structure that enhances the surge capability and performance of the MOSFET alone, a trench contact structure has been proposed in which an electrode layer is embedded in a trench provided in a portion of the semiconductor substrate exposed at a contact hole, whereby a contact between the electrode layer at an inner wall of the trench and a semiconductor part (semiconductor substrate) is formed (for example, refer to Japanese Patent No. 4488660, Japanese Patent No. 5578165, Japanese Patent No. 5388495, and Japanese Laid-Open Patent Publication No. 2009-043966).

Configuration of the MOSFET to have a trench contact structure enables parasitic bipolar operation at the time of avalanche breakdown to be suppressed, enhancing the surge capability. Further, configuration of the MOSFET to have a trench contact structure increases a mathematical area of contact of the electrode layer and the semiconductor portion, enabling contact resistance to be reduced. Therefore, by maintaining the contact resistance and reducing a size of a unit cell (configuration unit of an element), or by reducing the contact resistance without changing the size of the unit cell, the ON resistance RonA (mΩcm$^2$) of the MOSFET may be reduced.

On the other hand, to ensure high surge capability between the Vcc terminal and the GND terminal, a vertical diode (not depicted) for surge current absorption (for surge protection) is connected in parallel between the Vcc terminal and the GND terminal. The vertical diode is formed on the semiconductor substrate 113 on which the vertical MOSFET 110 for the output stage and various types of lateral circuit elements (the lateral n-channel MOSFET 120, etc.) are formed. At this time, to suppress increases in a number of processes, a p-type anode region of the vertical diode for surge current absorption is formed concurrently with the p$^+$-type diffusion region 131 constituting the inversion prevention layer described above.

Since the p$^+$-type diffusion region 131 and the p-type anode region of the vertical diode for surge current absorption have a same configuration, in the circuit region 142 as well, the vertical diode 130 having a same pn junction structure as that of the vertical diode for surge current absorption is formed at the p$^+$-type diffusion region 131 and an n$^-$-type substrate region 102a. In the circuit region 142 as well, this is equivalent to the vertical diode 130 of a small mathematical area being provided in plural. The n$^-$-type substrate region 102a is a portion of the type semiconductor layer 102 remaining at a same impurity concentration and conductivity type without formation of the p$^-$-type well region 121, etc.

In this manner, a part of the circuit region 142 of which a large mathematical area is occupied by the power IC is used as the vertical diode for surge protection. As a result, compared to a case in which the vertical diode for surge protection is formed alone at a part of the semiconductor substrate 113 other than the circuit region 142, an effective mathematical area of the pn junction of the vertical diode for surge protection increases. The surge capability of the vertical diode for surge protection increases in proportion with the mathematical area of the pn junction and therefore, accompanying an increase in the effective mathematical area of the pn junction of the vertical diode for surge protection, the surge capability of the power IC is enhanced.

Further, breakdown voltage of the vertical diode increases with temperature increases. Therefore, even with an assumption that current concentrates in the vertical diode 130 having a small mathematical area and formed using a portion of the circuit region 142, the breakdown voltage of the vertical diode 130 increases due to generated heat and therefore, the concentration of current at the vertical diode 130 is mitigated. Therefore, as described, even when the vertical diode 130 for surge protection and formed using a part of the circuit region 142 is scattered in the circuit region 142, local destruction at the circuit region 142 is unlikely to occur.

SUMMARY OF THE INVENTION

According to an embodiment of the present invention, a semiconductor device includes a semiconductor substrate; a first element provided on the semiconductor substrate; and a second element provided on the semiconductor substrate. The first element has: a first semiconductor region of a second conductivity type selectively provided in a surface layer of a first main surface of the semiconductor substrate of a first conductivity type; a second semiconductor region of the first conductivity type selectively provided in the first semiconductor region; a third semiconductor region of the second conductivity type selectively provided in the first semiconductor region, the third semiconductor region having an impurity concentration that is higher than an impurity concentration of the first semiconductor region; a semiconductor layer of the first conductivity type provided closer to a second main surface of the semiconductor substrate than is the first semiconductor region, the semiconductor layer being in contact with the first semiconductor region; a first gate insulating film provided in contact with a region of the first semiconductor region between the second semiconductor region and the semiconductor layer; a first gate electrode opposing the first semiconductor region, across the first gate insulating film; a first trench spanning the second semiconductor region and the third semiconductor region, the first trench provided at a first depth from the first main surface of the semiconductor substrate; a first electrode embedded in the first trench and electrically connected to the second semiconductor region and the third semiconductor region; and a second electrode provided at the second main surface of the semiconductor substrate and electrically connected to the semiconductor substrate. The second element has: a fourth semiconductor region of the second conductivity type selectively provided in the surface layer of the first main surface of the semiconductor substrate, the fourth semiconductor region being separated from the first semiconductor region; a fifth semiconductor region of the first conductivity type selectively provided in the fourth semiconductor region; a sixth semiconductor region of the first conductivity type selectively provided in the fourth semiconductor region, the sixth semiconductor region being separated from the fifth semiconductor region; a seventh semiconductor region of the second conductivity type selectively provided in the fourth semiconductor region, the seventh semiconductor region having an impurity concentration that is higher than an impurity concentration of the fourth semiconductor region; a second gate insulating film provided in contact with a region of the fourth semiconductor region between the fifth semiconductor region and the sixth semiconductor region; a second gate electrode opposing the fourth semiconductor region, across the second gate insulating film; a second trench spanning the fifth semiconductor region and the seventh semiconductor region, the second trench provided at a second depth from the first main surface of the semiconductor substrate; a third trench provided in the sixth semiconductor region, at a third depth from the first main surface of the semiconductor substrate; a third electrode embedded in the second trench and electrically connected to the fifth semiconductor region and the seventh semiconductor region; and a fourth electrode embedded in the third trench and electrically connected to the sixth semiconductor region. The semiconductor device further includes an eighth semiconductor region of the second conductivity type selectively provided in the fourth semiconductor region, the eighth semiconductor region being separated from the second element. The eighth semiconductor region penetrates the fourth semiconductor region from the first main surface of the semiconductor substrate and reaches the semiconductor layer. The eighth semiconductor region has an impurity concentration that is higher than the impurity concentration of the fourth semiconductor region. The third depth of the third trench is shallower than a depth of the sixth semiconductor region. The seventh semiconductor region covers a bottom of the second trench, and the impurity concentration of the seventh semiconductor region is highest at a predetermined depth from the first main surface of the semiconductor substrate.

In the embodiment, the second depth of the second trench is shallower than a depth of the fifth semiconductor region.

In the embodiment, the second depth of the second trench is deeper than a depth of the fifth semiconductor region.

In the embodiment, the semiconductor device further includes a ninth semiconductor region of the second conductivity type selectively provided in the fourth semiconductor region. The ninth semiconductor region covers a first inner wall of the second trench opposite a second inner wall of the second trench at the fifth semiconductor region. The ninth semiconductor region has an impurity concentration that is higher than the impurity concentration of the fourth semiconductor region.

In the embodiment, the seventh semiconductor region is in contact with the ninth semiconductor region.

In the embodiment, the seventh semiconductor region is in contact with the fifth semiconductor region.

In the embodiment, the seventh semiconductor region has a circular or an elliptical cross-sectional shape formed by an impurity of the second conductivity type diffusing in a radial shape in the fourth semiconductor region from the bottom of the second trench.

In the embodiment, the seventh semiconductor region opposes the sixth semiconductor region, across the fifth semiconductor region.

In the embodiment, the third trench is covered entirely by the sixth semiconductor region.

In the embodiment, the first depth of the first trench is shallower than a depth of the second semiconductor region.

In the embodiment, the first trench penetrates the second semiconductor region and reaches the first semiconductor region.

In the embodiment, the third semiconductor region is in contact with the second semiconductor region.

In the embodiment, the third semiconductor region has a circular or an elliptical cross-sectional shape formed by an impurity of the second conductivity type diffusing in a radial shape in the first semiconductor region from a bottom of the first trench.

In the embodiment, the eighth semiconductor region is provided along an outer periphery of the fourth semiconductor region and surrounds a periphery of the second element.

According to an embodiment of the present invention, a method of manufacturing a semiconductor device including a first element and a second element provided on a single semiconductor substrate, includes forming the first element including: selectively forming a first semiconductor region of a second conductivity type in a surface layer of a semiconductor layer of a first conductivity type constituting a first main surface of the semiconductor substrate of a first conductivity type; selectively forming a second semiconductor region of the first conductivity type in the first semiconductor region; selectively forming a third semiconductor region of the second conductivity type in the first semiconductor region, the third semiconductor region having an impurity concentration higher than an impurity concentration of the first semiconductor region; forming a first gate insulating film in contact with a region of the first semiconductor region between the second semiconductor region and the semiconductor layer; forming a first gate electrode opposing the first semiconductor region, across the first gate insulating film; forming a first trench at a first depth from the first main surface of the semiconductor substrate, the first trench spanning the second semiconductor region and the third semiconductor region; embedding a first electrode in the first trench; and forming a second electrode at a second main surface of the semiconductor substrate. The method further includes forming the second element including: selectively forming a fourth semiconductor region of the second conductivity type in the surface layer of the semiconductor layer, the fourth semiconductor region being separated from the first semiconductor region; selectively forming a fifth semiconductor region of the first conductivity type in the fourth semiconductor region; selectively forming a sixth semiconductor region of the first conductivity type in the fourth semiconductor region, the sixth semiconductor region being separated from the fifth semiconductor region; selectively forming a seventh semiconductor region of the second conductivity type in the fourth semiconductor region, the seventh semiconductor region having an impurity concentration that is higher than an impurity concentration of the fourth semiconductor region; forming a second gate insulating film in contact with a region of the fourth semiconductor region between the fifth semiconductor region and the sixth semiconductor region; forming a second gate electrode opposing the first semiconductor region, across the second gate insulating film; forming a second trench at a second depth from the first main surface of the semiconductor substrate, the second trench spanning the fifth semiconductor region and the seventh semiconductor region; forming a third trench in the sixth semiconductor region, at a third depth from the first main surface of the semiconductor substrate; embedding a third electrode in the second trench; and embedding a fourth electrode in the third trench. The method further includes selectively forming an eighth semiconductor region of the second conductivity type in the fourth semiconductor region, the eighth semiconductor region being separated from the second element. The eighth semiconductor region penetrates fourth semiconductor region from the first main surface of the semiconductor substrate and reaches the semiconductor layer. The eighth semiconductor region has an impurity concentration higher than the impurity concentration of the fourth semiconductor region. Selectively forming the seventh semiconductor region is performed after forming the second trench. Selectively forming the seventh semiconductor region includes ion implanting an impurity of the second conductivity type at a bottom of the second trench, forming the seventh semiconductor region covering the bottom of the second trench.

In the embodiment, selectively forming the second semiconductor region, selectively forming the fifth semiconductor region, and selectively forming the sixth semiconductor region are performed concurrently.

In the embodiment, forming the first trench and forming the second trench are performed concurrently.

In the embodiment, forming the first trench, forming the second trench, and forming the third trench are performed concurrently.

Objects, features, and advantages of the present invention are specifically set forth in or will become apparent from the following detailed description of the invention when read in conjunction with the accompanying drawings.

DETAILED DESCRIPTION OF THE INVENTION

Figure 17:
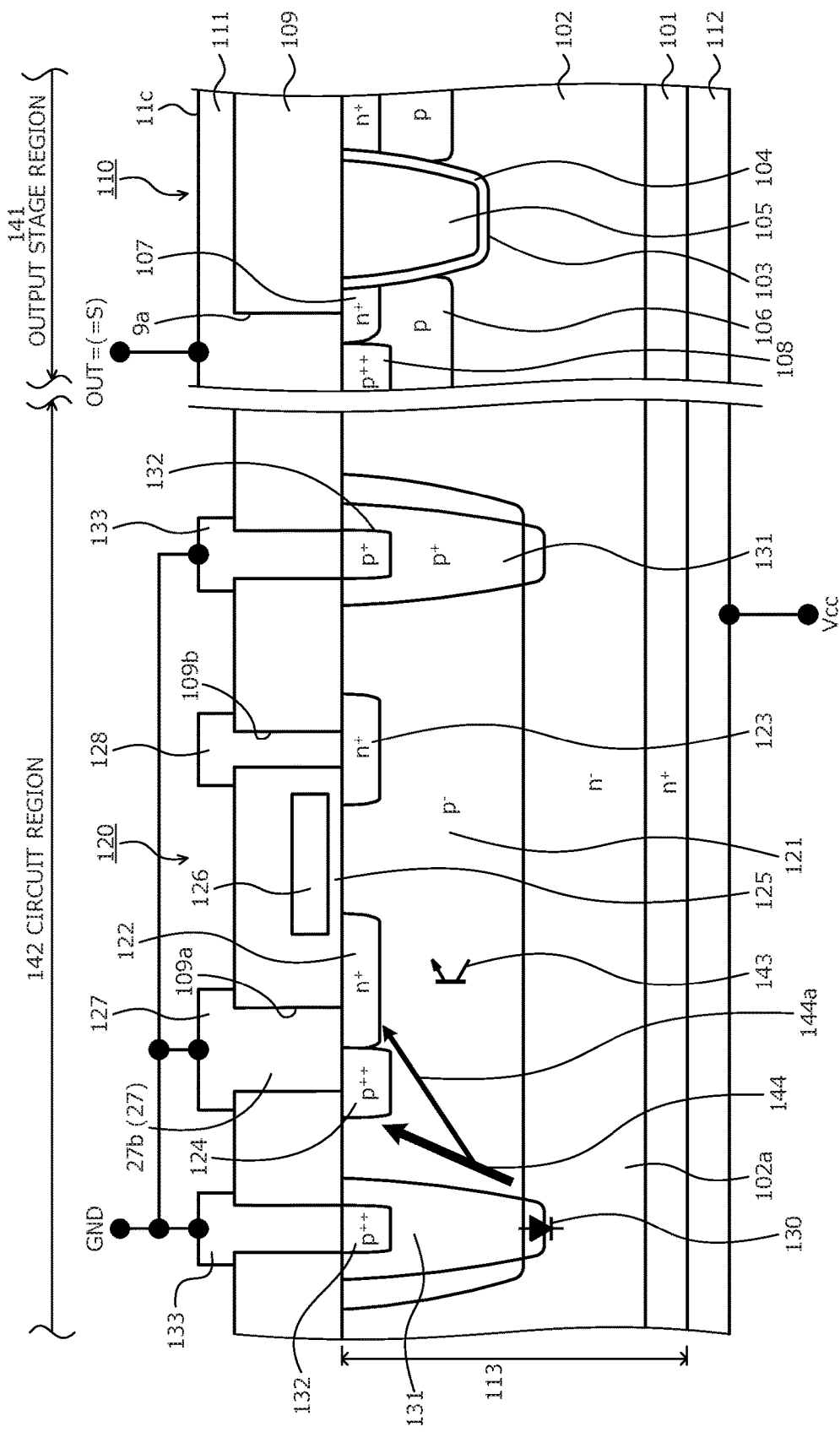
FIG. 17 is a cross-sectional view of a structure of a conventional semiconductor device.

First, problems associated with the related arts will be described. In the conventional power IC described (refer to FIG. 17), in realizing high surge capability between the Vcc terminal and the GND terminal, the following problems were newly found. In the circuit region 142 of the power IC, the $n^+$-type source region 122 having a high impurity concentration is formed as a source of the lateral n-channel MOSFET 120, whereby a vertical parasitic bipolar element 143 is formed in which the $n^+$-type source region 122 constitutes an emitter, the $p^-$-type well region 121 constitutes a base, and the $n^-$-type substrate region 102a constitutes a collector.

The $n^+$-type source region 122 of the lateral n-channel MOSFET 120 is electrically connected to the GND terminal of a low potential side. Therefore, when a current (hereinafter, avalanche current) 144 generated in the circuit region 142 accompanying increases in surge voltage increases, a current 144a that is a part of the avalanche current (hole current) flows to the $n^+$-type source region 122 by way of the $p^-$-type well region 121. The current 144a becomes base current, the parasitic bipolar element 143 turns ON and snapback occurs.

When snapback of the parasitic bipolar element 143 occurs, impedance of the circuit region 142 rapidly decreases, and the current 144a concentrates at the $n^+$-type source region 122 of the lateral n-channel MOSFET 120. Since the $n^+$-type source region 122 of the lateral n-channel MOSFET 120 is formed having a relatively small mathematical area, breakdown current capability of the lateral n-channel MOSFET 120 is small. Therefore, the $n^+$-type source region 122 of the lateral n-channel MOSFET 120 may be destroyed due to the concentration of the current 144a.

When the $n^+$-type source region 122 of the lateral n-channel MOSFET 120 is destroyed due to current concentration, the surge capability of the power IC overall is determined by the current 144a that causes the parasitic bipolar element 143 to snapback, even when the mathematical area of the pn junction of the vertical diode 130 is increased and the breakdown capability of the vertical diode 130 is increased. Therefore, the surge capability of the power IC overall cannot be effectively enhanced.

In resolving this problem, configuration of a structure (hereinafter, first structure) in which the circuit region 142 is not destroyed even when snapback of the parasitic bipolar element 143 occurs, or configuration of a structure (hereinafter, second structure) in which snapback of the parasitic bipolar element 143 is not likely to occur at the circuit region 142 is necessary. With the first structure, even when snapback of the parasitic bipolar element 143 occurs at the circuit region 142, provided that the circuit region 142 is not destroyed, at a predetermined current value or higher, the parasitic bipolar element 143 becomes a protection element and surge current absorption performance significantly increases compared to the vertical diode 130 and therefore, is useful in enhancing the surge capability. Nonetheless, when reductions in the size of the circuit region 142 are advanced, the mathematical area of the $n^+$-type source region 122 of the lateral n-channel MOSFET 120 decreases, a width of the contact hole 109a where the contact of the $n^+$-type source region 122 and the source electrode 127 is formed decreases, and the breakdown current capability of the contact hole 109a decreases. Therefore, due to the current concentration after snapback of the parasitic bipolar element 143, the contact hole 109a connected to the $n^+$-type source region 122 becomes prone to destruction and the breakdown current capability of the circuit region 142 further decreases. Therefore, achieving both a reduction in the size of the circuit region 142 and an increase in the breakdown current capability is difficult. Accordingly, realization of the second structure and making snapback of the parasitic bipolar element 143 at the circuit region 142 less likely to occur are desirable.

Japanese Patent No. 4488660, Japanese Patent No. 5578165, Japanese Patent No. 5388495, and Japanese Laid-Open Patent Publication No. 2009-043966 describe techniques related to characteristics improvement (surge capability enhancement, lower ON resistance) of a vertical MOSFET by a trench contact structure and are silent regarding resolving the problems caused by the parasitic structure of the circuit region of the power IC and regarding enhancing the surge capability of the power IC. Further, Japanese Patent No. 4488660, Japanese Patent No. 5578165, Japanese Patent No. 5388495, and Japanese Laid-Open Patent Publication No. 2009-043966 are silent regarding concurrently improving characteristics of the circuit region and the output stage of the power IC by a trench contact structure. Japanese Patent No. 4488660, Japanese Patent No. 5578165, Japanese Patent No. 5388495, and Japanese Laid-Open Patent Publication No. 2009-043966 are also silent regarding a trench contact structure that is suitably applicable for both a vertical semiconductor element for the output stage and a lateral semiconductor element for a circuit.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
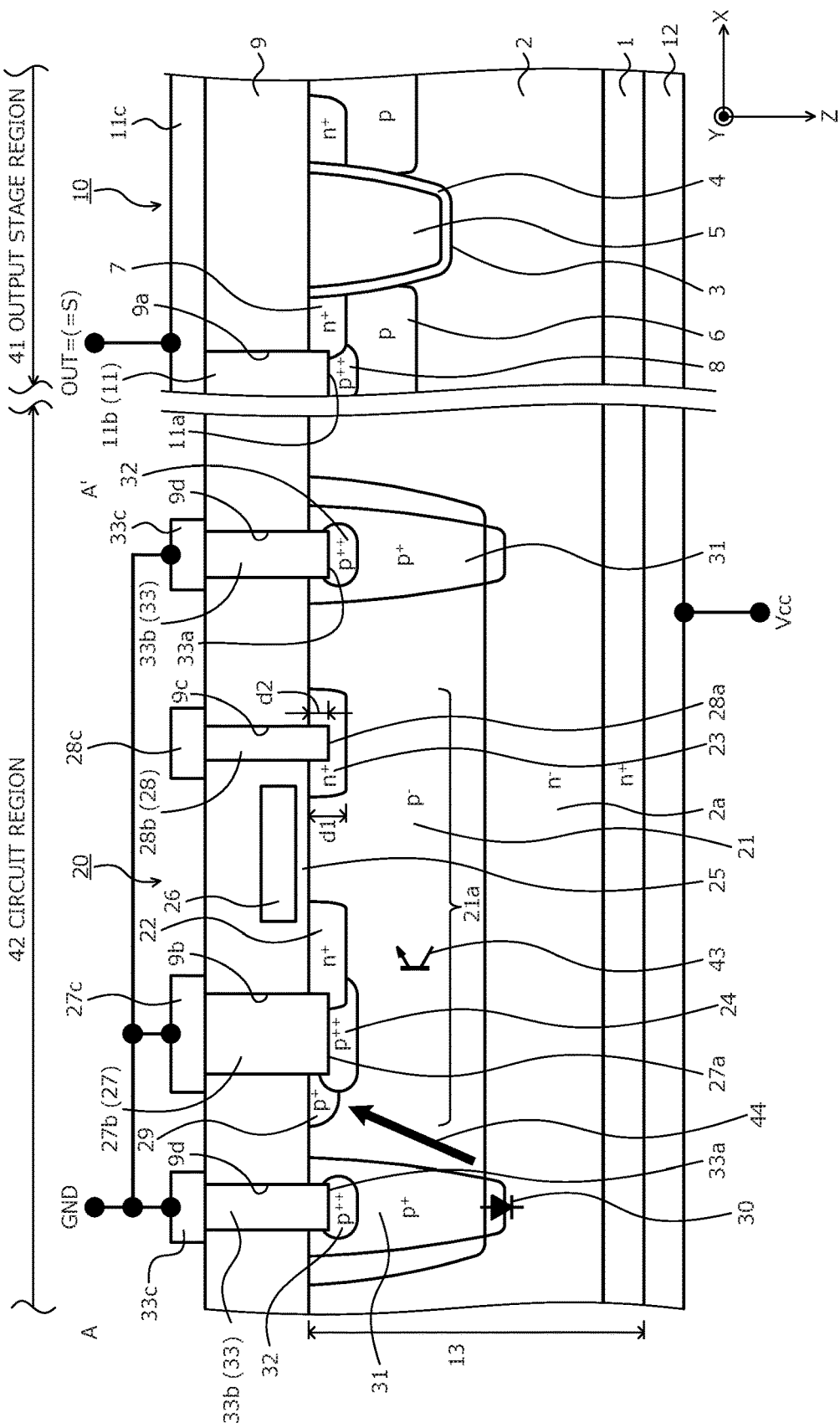
FIG. 1 is a cross-sectional view of a structure of a semiconductor device according to a first embodiment.

A structure of the semiconductor device according to a first embodiment will be described. FIG. 1 is a cross-sectional view of a structure of the semiconductor device according to the first embodiment. The cross-sectional view of a circuit region 42 depicted in FIG. 1 is taken along cutting line A-A' in FIG. 2. FIG. 1 depicts, as an example of the semiconductor device according to the first embodiment, an automotive, high-side power IC provided on a single semiconductor substrate (semiconductor chip) with a vertical n-channel power MOSFET for an output stage and a lateral CMOS for a control circuit. In FIG. 1, a thick insulating film, such as a local oxidation of silicon (LOCOS) film, provided between elements and isolating the elements is not depicted (similarly in FIGS. 2, 14 to 16).

The semiconductor device according to the first embodiment and depicted in FIG. 1 includes on a semiconductor substrate 13, an output stage region 41 and the circuit region 42. The semiconductor substrate 13 is an epitaxial substrate formed by forming on a front surface of an $n^+$-type starting substrate 1, an $n^-$-type semiconductor layer 2 by epitaxial growth. The output stage region 41 and the circuit region 42 are arranged separated from each other. An output terminal (OUT terminal) and a ground terminal (GND terminal) on a low potential side are provided at a front surface of the semiconductor substrate 13. A power supply voltage terminal (Vcc terminal) on a high potential side is provided at a rear surface of the semiconductor substrate 13.

In the output stage region 41, for example, a vertical MOSFET (first element) 10 having a trench gate structure is arranged as the vertical n-channel power MOSFET for the output stage. The vertical MOSFET 10 for the output stage includes a trench contact structure having a trench (hereinafter, first contact trench (first trench)) 11a for contact with a source electrode 11. In FIG. 1, although only one unit cell of the vertical MOSFET 10 is depicted, unit cells of a same configuration may be arranged adjacently.

In the output stage region 41, the $n^+$-type starting substrate 1 and the $n^-$-type semiconductor layer 2 respectively function as a drain region and a drift region of the vertical MOSFET 10 for the output stage. At a front surface side (side of the type semiconductor layer 2 opposite a side thereof opposing the $n^+$-type starting substrate 1) of the semiconductor substrate 13, a MOS gate structure of the vertical MOSFET 10 is provided.

The MOS gate structure of the vertical MOSFET 10 is a trench gate structure constituted by a trench (hereinafter, gate trench) 3, a gate insulating film (first gate insulating film) 4, a gate electrode (first gate electrode) 5, a p-type base region (first semiconductor region) 6, an $n^+$-type source region (second semiconductor region) 7, and a $p^{++}$-type contact region (third semiconductor region) 8. The gate trench 3 is provided a predetermined depth from the front surface of the semiconductor substrate 13. The gate electrode 5 is provided in the gate trench 3, via the gate insulating film 4.

The p-type base region 6 is provided at a depth shallower than that of the gate trench 3, from the front surface of the semiconductor substrate 13. The p-type base region 6, at a side wall of the gate trench 3, opposes the gate electrode 5 across the gate insulating film 4. The $n^+$-type source region 7 and the $p^{++}$-type contact region 8 are each selectively provided in the p-type base region 6. The $n^+$-type source region 7, at the side wall of the gate trench 3, opposes the gate electrode 5 across the gate insulating film 4.

The $p^{++}$-type contact region 8 covers a bottom of the first contact trench 11a. The $p^{++}$-type contact region 8 may cover a bottom corner part of the first contact trench 11a. The bottom corner part of the first contact trench 11a is a boundary of the side wall and the bottom of the first contact trench 11a. The $p^{++}$-type contact region 8 may be in contact with the $n^+$-type source region 7.

The $p^{++}$-type contact region 8 has a substantially circular or a substantially elliptical cross-sectional shape formed by a p-type impurity diffusing in a radial shape in the p-type base region 6, from the bottom of the first contact trench 11a. A depth of the $p^{++}$-type contact region 8 is deeper than a depth of the $n^+$-type source region 7. The $p^{++}$-type contact region 8 may be arranged a position separated from the front surface of the semiconductor substrate 13 in a depth direction Z.

FIG. 1 depicts a case in which the $p^{++}$-type contact region 8 has an impurity concentration lower than that of the $n^+$-type source region 7. In this case, the $p^{++}$-type contact region 8 covers an end of the $n^+$-type source region 7 toward the first contact trench 11a and extends to a bottom surface (end toward the $n^+$-type starting substrate 1) of the $n^+$-type source region 7. Although not depicted in FIG. 1, in the $p^{++}$-type contact region 8, a $p^+$-type contact region 8a may be selectively provided (refer to FIG. 9). In this case, the $p^+$-type contact region 8a and the $p^{++}$-type contact region 8 cover the bottom of the first contact trench 11a.

At the front surface of the semiconductor substrate 13, an interlayer insulating film 9 is provided so as to cover the gate electrode 5. In the interlayer insulating film 9, first, second, third, and fourth contact holes 9a, 9b, 9c 9d selectively exposing the front surface of the semiconductor substrate 13 are each provided. The first contact trench 11a is provided in a portion of the semiconductor substrate 13 exposed at the first contact hole 9a, the first contact trench 11a being provided at a depth from the front surface of the semiconductor substrate 13 shallower than is a depth of the $n^+$-type source region 7. A width of the first contact trench 11a is, for example, substantially equal to a width of the first contact hole 9a.

The bottom of the first contact trench 11a terminates in the $n^+$-type source region 7 and the $p^{++}$-type contact region 8. The $n^+$-type source region 7 is exposed at the side wall of the first contact trench 11a. When the unit cell of the vertical MOSFET 10 is arranged in plural adjacently, the $n^+$-type source region 7 is exposed at both side walls of the first contact trench 11a. At the bottom of the first contact trench 11a, the $p^{++}$-type contact region 8 (in a case where the p$^+$-type contact region 8a is provided, the p$^+$-type contact region 8a and the p$^{++}$-type contact region 8 are) is exposed.

In the first contact trench 11a, a conductive film 11b containing, for example, tungsten (W) is embedded as a source electrode (source terminal (first electrode)) 11. The n$^+$-type source region 7 and the p$^{++}$-type contact region 8 are electrically connected to the output terminal, via the conductive film 11b and a metal wiring layer 11c. At the rear surface (rear surface of the n$^+$-type starting substrate 1) of the semiconductor substrate 13, a drain electrode (drain terminal (second electrode)) 12 of the vertical MOSFET 10 is provided. The drain electrode 12 is, for example, the Vcc terminal to which an automotive battery is connected.

In the circuit region 42, circuits such as a control circuit are provided. In the circuit region 42 depicted in FIG. 1, of the lateral p-channel MOSFET and the lateral n-channel MOSFET complementary connected and constituting the control-circuit lateral CMOS, the lateral n-channel MOSFET (second element) 20 alone is depicted. The lateral n-channel MOSFET 20 for the control circuit includes a trench contact structure having a trench (hereinafter, second contact trench (second trench)) 27a for contact with a source electrode 27 and a trench (hereinafter, third contact trench (third trench)) 28a for contact with a drain electrode 28.

For example, in the circuit region 42, in a surface layer of the front surface of the semiconductor substrate 13, a p$^-$-type well region (fourth semiconductor region) 21 is selectively provided. A depth of the p$^-$-type well region 21, for example, may be deeper than a depth of the p-type base region 6 of the vertical MOSFET 10 for the output stage. In the p$^-$-type well region 21, an n$^+$-type source region (fifth semiconductor region) 22, an n$^+$-type drain region (sixth semiconductor region) 23, and a p$^{++}$-type contact region (seventh semiconductor region) 24 of the lateral n-channel MOSFET 20 are each selectively provided.

The n$^+$-type source region 22 is arranged separated from the n$^+$-type drain region 23. The n$^+$-type source region 22 is in contact with a conductive film 27b, at one inner wall of the second contact trench 27a. The n$^+$-type drain region 23 covers the third contact trench 28a entirely. A depth d1 of the n$^+$-type drain region 23 may be, for example, about 0.5 µm to 0.6 µm. Further, a depth of the n$^+$-type source region 22 and a depth of the n$^+$-type drain region 23 may be, for example, equal to the depth of the n$^+$-type source region 7 of the vertical MOSFET 10.

The p$^{++}$-type contact region 24 is provided at a first side of the n$^+$-type source region 22 opposite a second side thereof toward the n$^+$-type drain region 23. The p$^{++}$-type contact region 24 covers a bottom of the second contact trench 27a. The p$^{++}$-type contact region 24 may cover the bottom of the second contact trench 27a, spanning across a bottom corner part thereof. The bottom corner part of the second contact trench 27a is a boundary an inner wall and the bottom of the second contact trench 27a. The p$^{++}$-type contact region 24 may be in contact with the n$^+$-type source region 22.

The p$^{++}$-type contact region 24 has a substantially circular or a substantially elliptical cross-sectional shape formed by a p-type impurity diffusing in a radial shape in the p$^-$-type well region 21, from the bottom of the second contact trench 27a. A depth of the p$^{++}$-type contact region 24 is deeper than the depth of the n$^+$-type source region 22. The p$^{++}$-type contact region 24 may be arranged at a position separated from the front surface of the semiconductor substrate 13 in the depth direction Z. FIG. 1 depicts a case in which the p$^{++}$-type contact region 24 has an impurity concentration that is lower than an impurity concentration of the n$^+$-type source region 22. In this case, the p$^{++}$-type contact region 24 covers an end of the n$^+$-type source region 22 toward the second contact trench 27a and extends to a bottom surface of (end toward the n$^+$-type starting substrate 1) of the n$^+$-type source region 22.

Further, in the p$^-$-type well region 21, a p$^+$-type contact region (ninth semiconductor region) 29 may be selectively provided so as to cover an inner wall of the second contact trench 27a, opposite an inner wall thereof at the n$^+$-type source region 22. The p$^+$-type contact region 29 may be in contact with the p$^{++}$-type contact region 24. A reason for this is that a configuration in which the conductive film 27b in the second contact trench 27a is not in contact with the p$^-$-type well region 21 having a high resistance becomes possible.

On a surface of a portion of the p$^-$-type well region 21 between the n$^+$-type source region 22 and the n$^+$-type drain region 23, a gate electrode (second gate electrode) 26 is provided via a gate insulating film (second gate insulating film) 25.

Further, in the p$^-$-type well region 21, a p$^+$-type diffusion region (eighth semiconductor region) 31 that penetrates the p$^-$-type well region 21 in the depth direction Z and reaches an n$^-$-type substrate region (first conductivity type layer) 2a is provided. The n$^-$-type substrate region 2a is a portion of the n$^-$-type semiconductor layer 2 remaining at a same impurity concentration and conductivity type without formation of the p$^-$-type well region 21, etc. The depth direction Z is a direction from the front surface of the semiconductor substrate 13 toward the rear surface. In other words, a depth of the p$^+$-type diffusion region 31 is equal to or deeper than the depth of the p$^-$-type well region 21.

The p$^+$-type diffusion region 31 is provided separated from the n$^+$-type source region 22, the n$^+$-type drain region 23, and the p$^{++}$-type contact region 24 of the lateral n-channel MOSFET 20. Further, the p$^+$-type diffusion region 31 is provided, for example, near an outer periphery of the p$^-$-type well region 21, for example, along a periphery of the p$^-$-type well region 21, and surrounds a periphery of a central part (portion of the p$^-$-type well region 21 farther inward than the p$^+$-type diffusion region 31) 21a of the p$^-$-type well region 21. At the central part 21a of the p$^-$-type well region 21, plural unit cells of the lateral n-channel MOSFET 20 may be arranged adjacently.

The p$^+$-type diffusion region 31 functions as an inversion prevention layer that prevents inversion of the p$^-$-type well region 21 by potentials of metal wiring layers 27c, 28c, 33c stacked on the front surface of the semiconductor substrate 13. Further, the p$^+$-type diffusion region 31 functions as a guard ring that prevents adverse effects such as noise from another device adjacent to the lateral n-channel MOSFET 20. At a pn junction of the p$^+$-type diffusion region 31 and the n$^-$-type substrate region 2a, a vertical diode 30 for surge protection is formed.

In the p$^+$-type diffusion region 31, a p$^{++}$-type contact region 32 is selectively provided. The p$^{++}$-type contact region 32 covers a bottom of a trench (hereinafter, fourth contact trench) 33a for contact with a contact electrode 33 of a ground potential. The p$^{++}$-type contact region 32 may cover a bottom corner part of the fourth contact trench 33a. The bottom corner part of the fourth contact trench 33a is a boundary of an inner wall and the bottom of the fourth contact trench 33a.

The p$^{++}$-type contact region 32 has a substantially circular or a substantially elliptical cross-sectional shape formed by a p-type impurity diffusing in a radial shape in the p$^+$-type diffusion region 31, from the bottom of the fourth contact trench 33a. A depth of the p$^{++}$-type contact region 32 may be equal to, for example, the depth of the p$^{++}$-type contact region 8 of the vertical MOSFET 10 or the depth of the p$^{++}$-type contact region 24 of the lateral n-channel MOSFET 20.

The second contact trench 27a is provided in a portion of the semiconductor substrate 13 exposed at the second contact hole 9b, the second contact trench 27a being provided at a depth that is shallower from the front surface of the semiconductor substrate 13 than is the depth of the n$^+$-type source region 22. The bottom of the second contact trench 27a terminates in the n$^+$-type source region 22, the p$^{++}$-type contact region 24, and the p$^+$-type contact region 29. A width of the second contact trench 27a is, for example, substantially equal to a width of the second contact hole 9b.

At the bottom of the second contact trench 27a, the p$^{++}$-type contact region 24 is exposed. At one inner wall of the second contact trench 27a, the n$^+$-type source region 22 is exposed and at the other inner wall, the p$^+$-type contact region 29 is exposed. In a case in which the p$^+$-type contact region 29 is not provided, at the other inner wall of the second contact trench 27a, the p$^-$-type well region 21 is exposed.

In the second contact trench 27a, the conductive film 27b containing, for example, tungsten is embedded as the source electrode (source terminal (third electrode)) 27. The n$^+$-type source region 22 and the p$^{++}$-type contact region 24 are electrically connected to the GND terminal, via the conductive film 27b and the metal wiring layer 27c.

The third contact trench 28a is provided at a predetermined depth d2 from the front surface of the semiconductor substrate 13, in a portion of the semiconductor substrate 13 exposed at the third contact hole 9c. The depth d2 of the third contact trench 28a may be, for example, equal to a depth of the second contact trench 27a and more specifically may be, for example, about 0.2 μm to 0.3 μm. A bottom of the third contact trench 28a terminates in the n$^+$-type drain region 23.

In other words, the n$^+$-type drain region 23 covers the third contact trench 28a completely, and the drain electrode 28 and the p$^-$-type well region 21 are separated by the n$^+$-type drain region 23. When the third contact trench 28a penetrates the n$^+$-type drain region 23 and reaches the p$^-$-type well region 21 constituting a back gate, the lateral n-channel MOSFET 20 functions as a MOSFET and therefore, is not desirable.

A width of the third contact trench 28a is, for example, substantially equal to a width of the third contact hole 9c. In the third contact trench 28a, a conductive film 28b containing, for example, tungsten is embedded as a drain electrode (drain terminal (fourth electrode)) 28. The n$^+$-type drain region 23 is electrically connected, via the conductive film 28b and the metal wiring layer 28c, with a terminal of a potential higher than that of the source electrode 27.

The fourth contact trench 33a is provided at a predetermined depth from the front surface of the semiconductor substrate 13, in a portion of the semiconductor substrate 13 exposed at the fourth contact hole 9d. A depth of the fourth contact trench 33a may be, for example, equal to a depth of the second contact trench 27a. A bottom of the fourth contact trench 33a terminates in the p$^{++}$-type contact region 32 and at the bottom of the fourth contact trench 33a, the p$^{++}$-type contact region 32 is exposed.

A width of the fourth contact trench 33a is, for example, substantially equal to a width of the fourth contact hole 9d. In the fourth contact trench 33a, a conductive film 33b containing, for example, tungsten is embedded as the contact electrode 33 of the ground potential. The p$^-$-type well region 21 constituting the back gate is electrically connected to the GND terminal, via the p$^+$-type diffusion region 31, the p$^{++}$-type contact region 32, the conductive film 33b and the metal wiring layer 33c.

Figure 2:
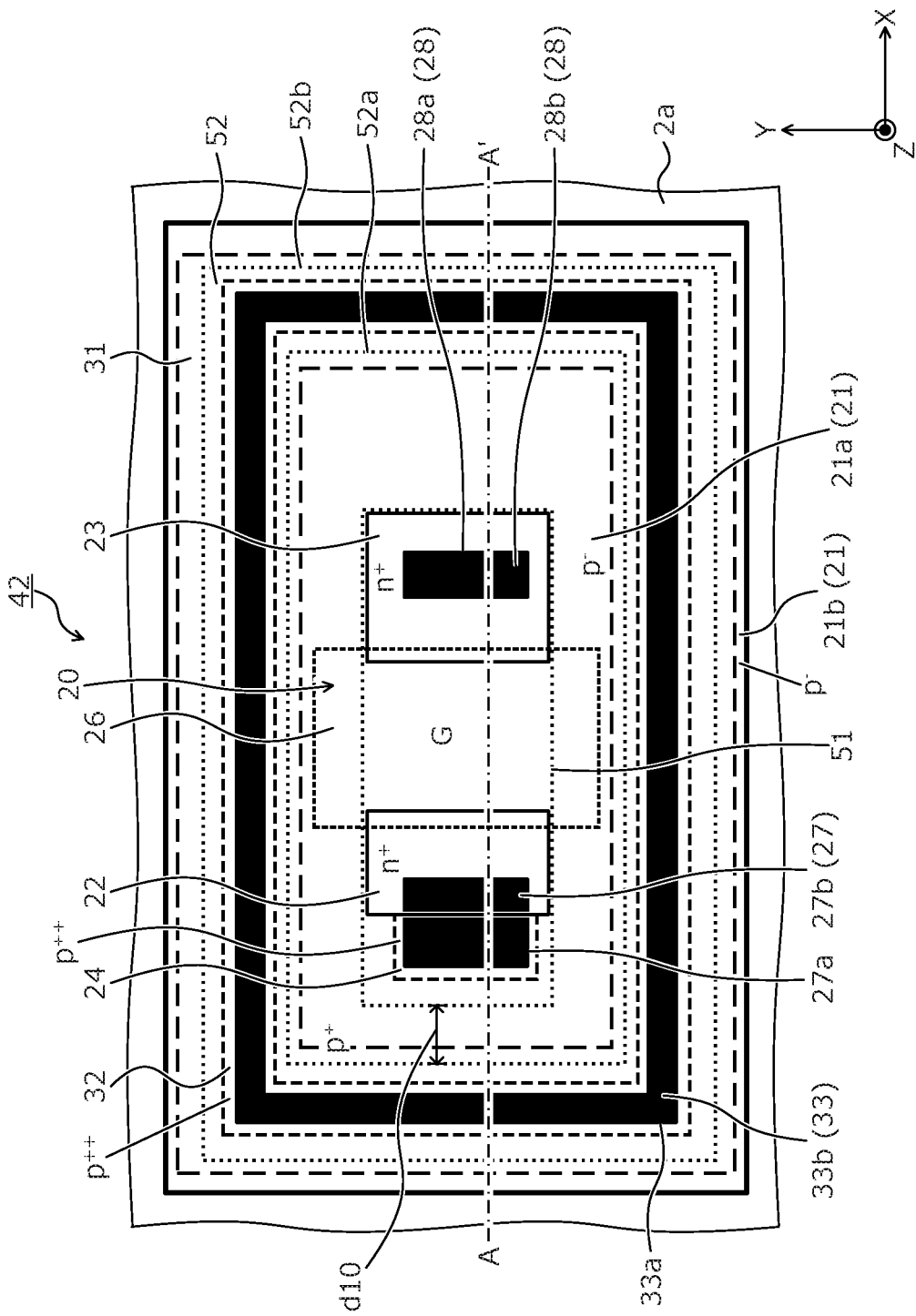
FIG. 2 is a plan view depicting a layout of a circuit region in FIG. 1 as viewed from a front surface side of a semiconductor substrate.
Figure 3:
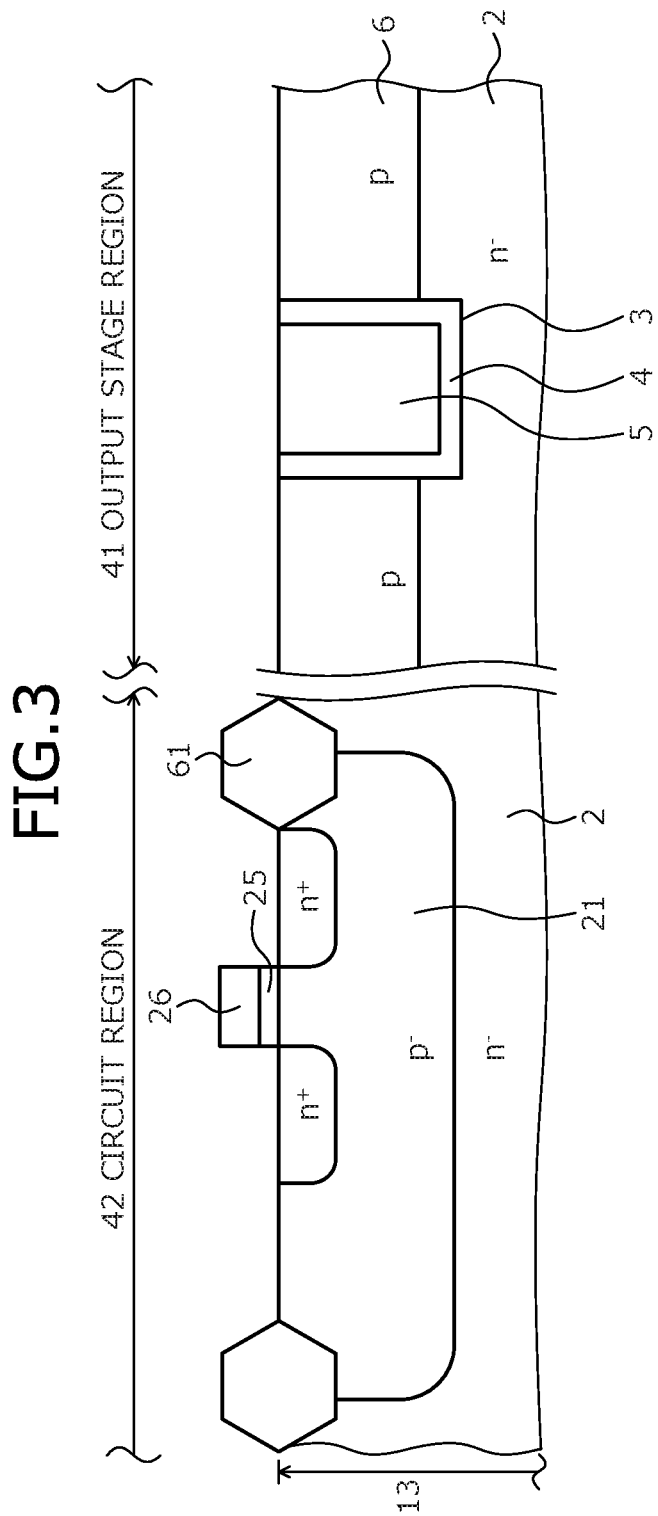
FIG. 3 is a cross-sectional view of the semiconductor device according to the first embodiment during manufacture.

Planar shapes and layouts of components of the circuit region 42 as viewed from the front surface side of the semiconductor substrate will be described. FIG. 2 is a plan view depicting a layout of the circuit region in FIG. 1 as viewed from the front surface side of the semiconductor substrate. As depicted in FIG. 2, the p$^-$-type well region 21 constituting the back gate has, for example, a substantially rectangular planar shape. In the p$^-$-type well region 21, an active region (hereinafter, first active region) 51 of the lateral n-channel MOSFET 20 and an active region (hereinafter, second active region) 52 of the vertical diode 30 for surge protection are provided.

The first active region 51 is a region through which a main current flows in an ON state of the lateral n-channel MOSFET 20. The first active region 51, for example, is arranged in a substantially rectangular planar shape at a central part of the semiconductor substrate 13. The second active region 52 is arranged separated from the first active region 51 and surrounds a periphery of the first active region 51, in a substantially rectangular shape. In the second active region 52, the vertical diode 30 for surge protection is arranged.

A distance d10 between the first active region 51 and the second active region 52 may be reduced to a distance that is at least a smallest dimension that may be left of a LOCOS film due to constraints of processing precision and that does not allow the p$^+$-type diffusion region 31 surrounding the second active region 52 to enter a portion in the first active region 51, covered by the gate electrode 26. In FIG. 2, an outline of the first active region 51 is indicated by finest dotted line (similarly for the first active region in FIGS. 14 to 16, a third active region in FIGS. 14, 15). The second active region 52 is a region between dotted lines 52a, 52b of a same fineness as the dotted line indicating the outline of the first active region 51 (similarly for the second active region in FIGS. 14 to 16).

In particular, in the first active region 51, the n$^+$-type source region 22, the n$^+$-type drain region 23, and the p$^{++}$-type contact region 24 of the lateral n-channel MOSFET 20 are arranged. The first active region 51 has a surface area that is as small as possible while enabling all of the unit cells of the lateral n-channel MOSFET 20 to be arranged therein and, for example, has a substantially rectangular planar shape. The n$^+$-type source region 22, the n$^+$-type drain region 23, and the p$^{++}$-type contact region 24 have, for example, substantially rectangular planar shapes. A surface area of the n$^+$-type drain region 23 may be, for example, larger than a surface area of the n$^+$-type source region 22.

Between the n$^+$-type source region 22 and the n$^+$-type drain region 23, for example, the gate electrode 26 is provided in a substantially rectangular planar shape. The p$^{++}$-type contact region 24, as described, is provided at the first side of the n$^+$-type source region 22 opposite the second side thereof toward the n$^+$-type drain region 23, and is in contact with the n$^+$-type source region 22. The p$^{++}$-type contact region 24 terminates in the first active region 51 and does not extend outside the first active region 51 (toward the p$^+$-type diffusion region 31). A surface area of the p$^{++}$-type contact region 24 may be, for example, smaller than the surface area of the n$^+$-type source region 22.

The n$^+$-type source region 22, the n$^+$-type drain region 23, the p$^{++}$-type contact region 24, and the gate electrode 26, for example, are arranged in a striped shape extending along a direction (hereinafter, second direction) Y orthogonal to a direction (hereinafter, first direction) X along which the n+-type source region 22 and the n+-type drain region 23 are arranged. The second and third contact trenches 27a, 28a have, for example, a substantially rectangular planar shape. The second contact trench 27a is arranged so as to span the n+-type source region 22 and the p++-type contact region 24. The third contact trench 28a is arranged in the n+-type drain region 23.

In the second active region 52, the p+-type diffusion region 31 and the p++-type contact region 32 constituting the vertical diode 30 for surge protection are arranged. The second active region 52 is isolated from the first active region 51 by a non-depicted thick insulating film such as a LOCOS film. In other words, between the first active region 51 and the second active region 52, a LOCOS film is provided at the front surface of the semiconductor substrate 13.

The p+-type diffusion region 31 is arranged, for example, in the p−-type well region 21, in a layout surrounding a periphery of the lateral n-channel MOSFET 20, in a substantially rectangular shape. The p+-type diffusion region 31 may be provided extending farther inward (toward the first active region 51) than the second active region 52 and/or farther outward the second active region 52 (toward an edge of the semiconductor substrate 13). The p++-type contact region 32 is provided, for example, in the p+-type diffusion region 31, in a layout surrounding the periphery of the first active region 51. The fourth contact trench 33a is arranged in the p++-type contact region 32, in a rectangular shape along the p++-type contact region 32 and surrounding the periphery of the first active region 51.

Although a layout of the output stage region 41 depicted in FIG. 1 is not depicted as viewed from the front surface side of the semiconductor substrate, layouts of the n+-type source region 7, the p++-type contact region 8, and the first contact trench 11a of the vertical MOSFET 10 for the output stage arranged in the output stage region 41 are respectively, for example, the same as those of the n+-type source region 22, the p++-type contact region 24, and the second contact trench 27a of the lateral n-channel MOSFET 20 for the control circuit arranged in the circuit region 42.

A method of manufacturing the semiconductor device according to the first embodiment will be described taking, as an example, a case in which the p+-type contact regions 8a, 29 are provided in the vertical MOSFET 10 and the lateral n-channel MOSFET 20, respectively. FIGS. 3, 4, 5, 6, 7, 8, and 9 are cross-sectional views of the semiconductor device according to the first embodiment during manufacture. FIGS. 3 to 9 schematically depict the lateral n-channel MOSFET 20 for the control circuit arranged in the circuit region 42 depicted in FIG. 1; and FIGS. 3 to 9 schematically depict the vertical MOSFET 10 for the output stage arranged in the output stage region 41 depicted in FIG. 1 (similarly in FIGS. 10 to 13).

In FIGS. 3 to 9, although the p+-type diffusion region 31, the p++-type contact region 32, the fourth contact trench 33a, and the conductive film 33b are not depicted, the p+-type diffusion region 31, for example, is formed by ion implantation between formation of the p−-type well region 21 and formation of the p++-type contact region 32. The p++-type contact region 32, the fourth contact trench 33a, and the conductive film 33b are respectively formed concurrently with the p++-type contact region 24, the second contact trench 27a, and the conductive film 27b of the lateral n-channel MOSFET 20.

First, the n−-type semiconductor layer 2 is formed on the front surface of the n+-type starting substrate 1 by epitaxial growth, whereby the semiconductor substrate (semiconductor wafer) 13 is fabricated (refer to FIG. 1). Next, as depicted in FIGS. 3A and 3B, in the output stage region 41, the p-type base region 6 is selectively formed in a surface layer of the n−-type semiconductor layer 2 by photolithography and ion implantation. Further, in the circuit region 42, the p−-type well region 21 constituting the back gate is selectively formed in the surface layer of the n−-type semiconductor layer 2 by photolithography and ion implantation.

Next, for example, a thick insulating film such as a LOCOS film 61 is formed so as to surround the periphery of the p−-type well region 21, whereby the circuit region 42 and a portion other than the circuit region 42 of the p−-type well region 21 (for example, the output stage region 41) are isolated. Next, in the output stage region 41, the gate trench 3 is formed penetrating the p-type base region 6 from the front surface of the semiconductor substrate 13 in the depth direction Z, and the gate electrode 5 is formed in the gate trench 3, via the gate insulating film 4.

Further, in the circuit region 42, the gate electrode 26 is formed on a surface of the p−-type well region 21, via the gate insulating film 25. The gate insulating films 4, 25 may be formed concurrently and, for example, may be a silicon oxide ($SiO_2$) film formed by subjecting a surface of the semiconductor substrate 13 and an inner wall of the gate trench 3 to thermal oxidation. The gate electrodes 5, 26 may be formed concurrently and, for example, may be formed by patterning a poly-silicon (poly-Si) layer deposited on an oxide film constituting the gate insulating films 4, 25 so that the poly-Si layer remains only at predetermined sites. The p-type base region 6 may be formed after formation of the gate trench 3, the gate insulating film 4, and the gate electrode 5.

Figure 4:
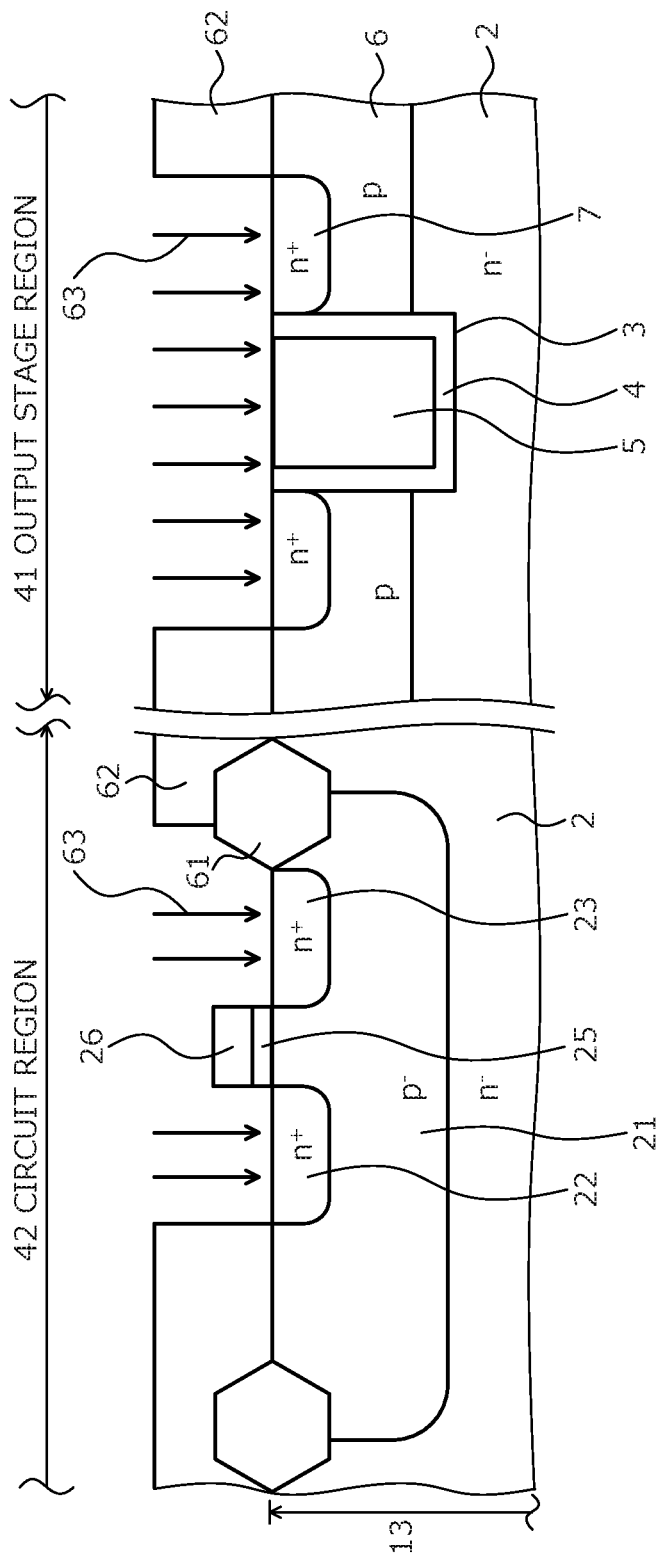
FIG. 4 is a cross-sectional view of the semiconductor device according to the first embodiment during manufacture.

Next, as depicted in FIG. 4, a resist film 62 having openings at portions corresponding to formation regions of the n+-type source region 7 of the vertical MOSFET 10, and the n+-type source region 22 and the n+-type drain region 23 of the lateral n-channel MOSFET 20 is formed on the front surface of the semiconductor substrate 13. At this time, at an opening of the resist film 62, a portion of the gate electrode 26 between the formation region of the n+-type source region 22 and the formation region of the n+-type drain region 23 is exposed. Additionally, at an opening of the resist film 62, a portion of the gate trench 3 between adjacent n+-type source regions 7 is exposed.

Next, an ion implantation 63 of an n-type impurity is performed using the resist film 62, the LOCOS film 61 and the gate electrodes 5, 26 as masks. As a result, in the output stage region 41, the n+-type source region 7 of the vertical MOSFET 10 is formed in the surface layer of the front surface of the semiconductor substrate 13, in a self-aligning manner with the gate trench 3. Additionally, in the circuit region 42, the n+-type source region 22 and the n+-type drain region 23 of the lateral n-channel MOSFET 20 are formed in the surface layer of the front surface of the semiconductor substrate 13, in a self-aligning manner with the gate electrode 26.

Figure 5:
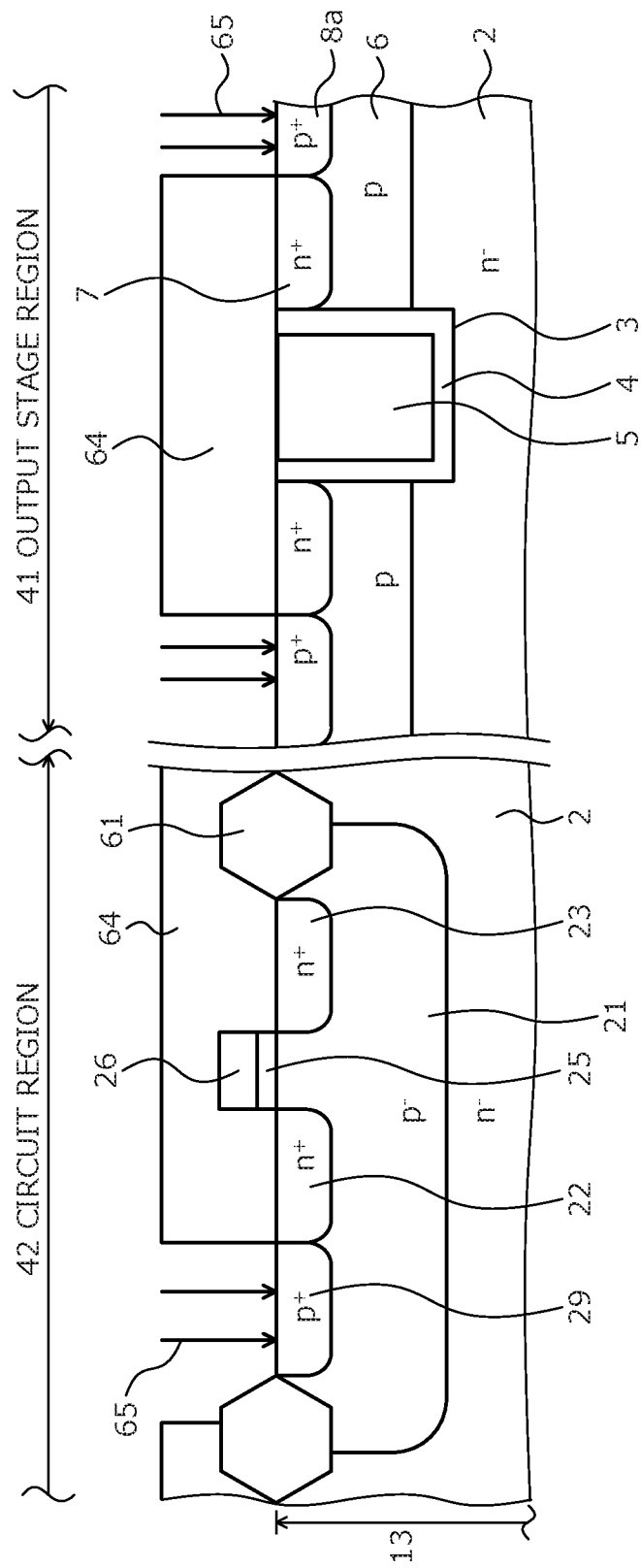
FIG. 5 is a cross-sectional view of the semiconductor device according to the first embodiment during manufacture.

Next, as depicted in FIG. 5, after the resist film 62 is removed, a resist film 64 having openings at portions corresponding to formation regions of the p+-type contact regions 8a, 29 of the vertical MOSFET 10 and the lateral n-channel MOSFET 20 is formed on the front surface of the semiconductor substrate 13. Next, an ion implantation 65 of a p-type impurity is performed using the resist film 64 and the LOCOS film 61 as masks, whereby the p+-type contact regions 8a, 29 are selectively formed in the surface layer of the front surface of the semiconductor substrate 13.

Figure 6:
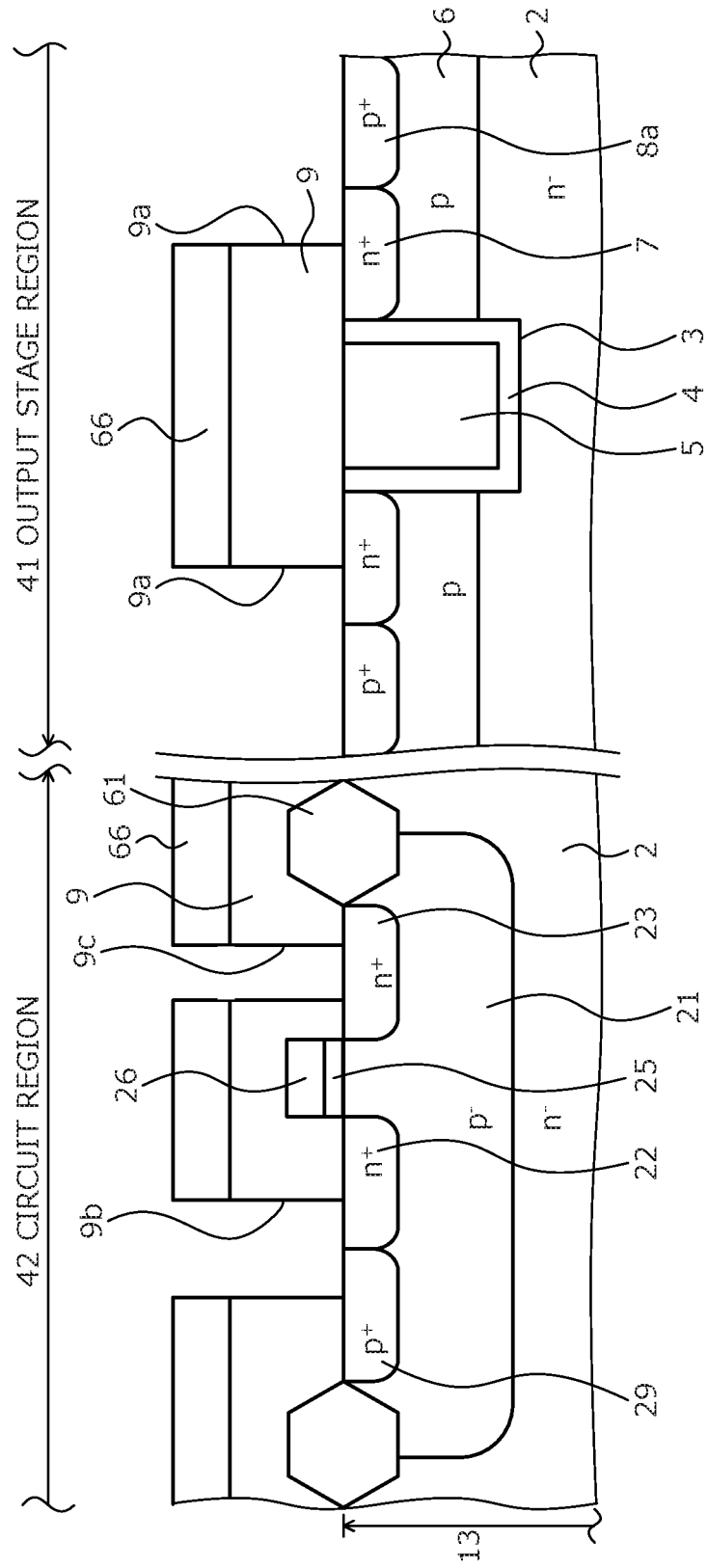
FIG. 6 is a cross-sectional view of the semiconductor device according to the first embodiment during manufacture.

Next, as depicted in FIG. 6, after the resist film 64 is removed, the interlayer insulating film 9 is formed on the front surface of the semiconductor substrate 13 so as to cover the gate electrodes 5, 26. Next, a resist film 66 having openings corresponding to formation regions of the first to the third contact holes 9a to 9c is formed on a surface of the interlayer insulating film 9. Next, etching is performed using the resist film 66 as a mask, whereby the interlayer insulating film 9 is selectively removed and the first to the third contact holes 9a to 9c are formed penetrating the interlayer insulating film 9 in the depth direction Z.

Figure 7:
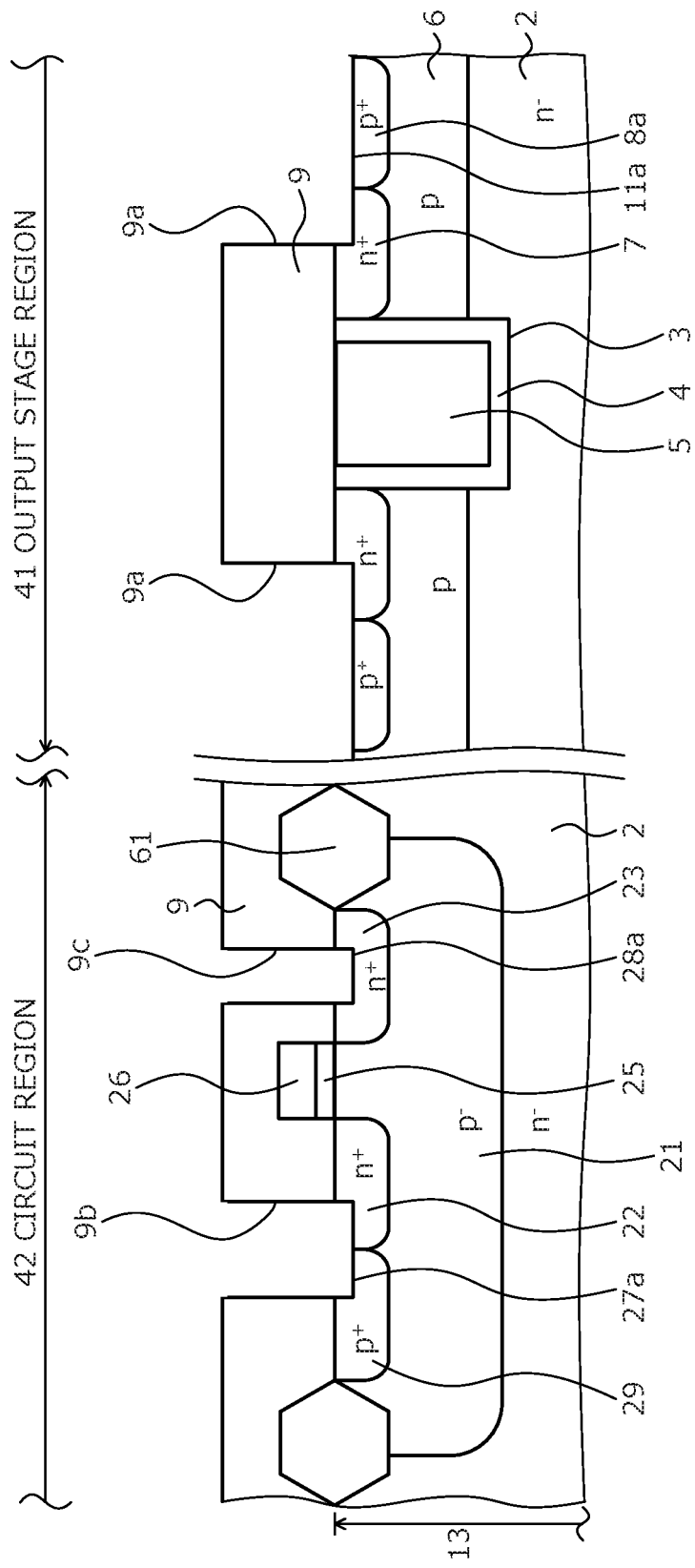
FIG. 7 is a cross-sectional view of the semiconductor device according to the first embodiment during manufacture.

Next, as depicted in FIG. 7, after the resist film 66 is removed, etching is performed using the interlayer insulating film 9 as a mask, whereby at portions of the front surface of the semiconductor substrate 13 exposed at the first to the third contact holes 9a to 9c, the first to the third contact trenches 11a, 27a, 28a are respectively formed. At this time, the third contact trench 28a is formed at the depth d2 that is shallower than the depth of the $n^+$-type drain region 23 and the bottom of the third contact trench 28a terminates in the $n^+$-type drain region 23. Further, the $n^+$-type drain region 23 covers the third contact trench 28a entirely.

The depth d2 of the third contact trench 28a is shallower than the depth d1 of the $n^+$-type drain region 23, whereby the first contact trench 11a is formed at a depth shallower than depths of the $n^+$-type source region 7 and the $p^+$-type contact region 8a, and thus, the bottom of the first contact trench 11a terminates in the $n^+$-type source region 7 and the $p^+$-type contact region 8a. Additionally, the second contact trench 27a is formed at a depth shallower than depths of the $n^+$-type source region 22 and the $p^+$-type contact region 29, and thus, the bottom of the second contact trench 27a terminates in the $n^+$-type source region 22 and the $p^+$-type contact region 29.

Figure 8:
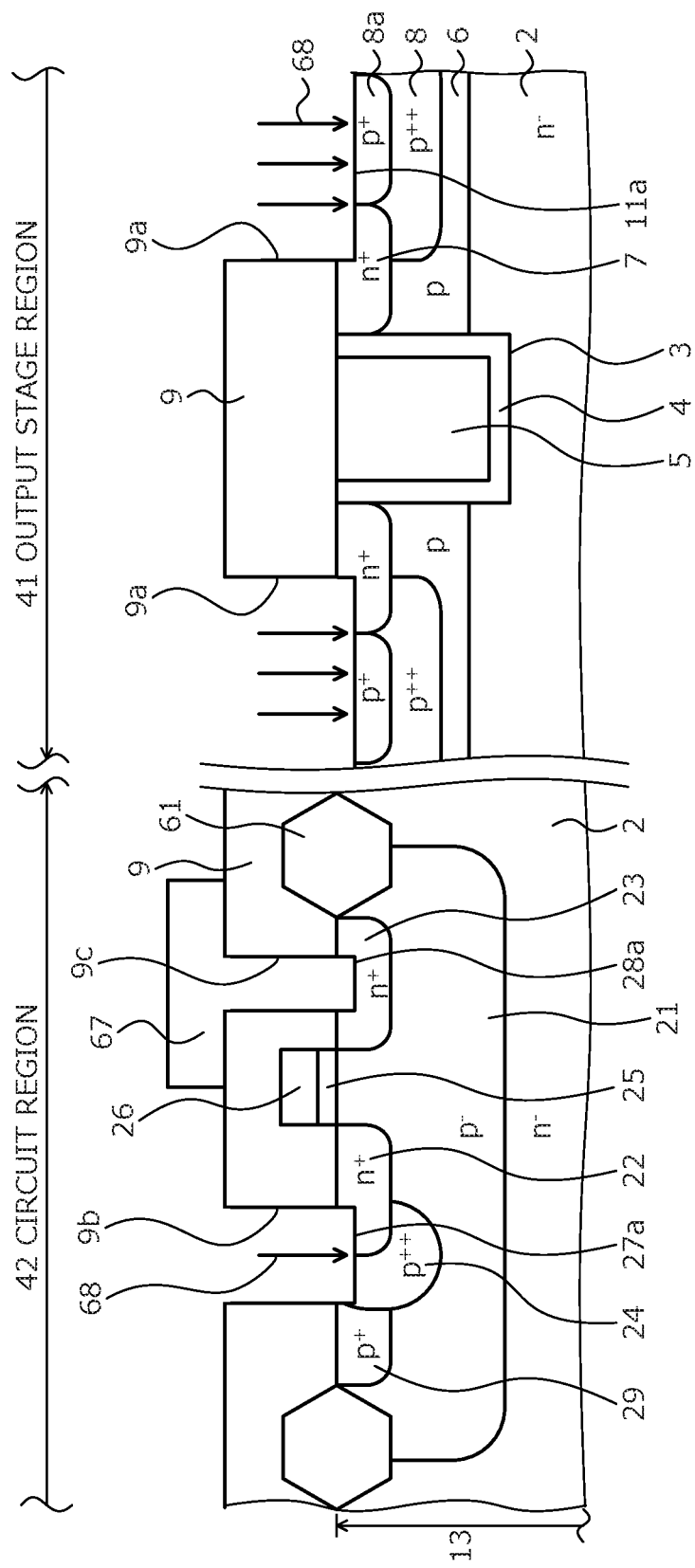
FIG. 8 is a cross-sectional view of the semiconductor device according to the first embodiment during manufacture.

Next, as depicted in FIG. 8, a resist film 67 is embedded in the third contact trench 28a, whereby the third contact trench 28a is covered by the resist film 67. A portion (the $n^+$-type drain region 23) of the front surface of the semiconductor substrate 13 exposed at the third contact trench 28a is covered by the resist film 67. Portions (the $n^+$-type source regions 7, 22 and the $p^+$-type contact regions 8a, 29) of the front surface of the semiconductor substrate 13 exposed at the first and the second contact trenches 11a, 27a are exposed at openings of the resist film 67.

Next, an ion implantation 68 of a p-type impurity at the bottoms of the first and the second contact trenches 11a, 27a is performed using the resist film 67 and the interlayer insulating film 9 as masks. As a result, at a position deeper than the $n^+$-type source region 7 and the $p^+$-type contact region 8a, the $p^{++}$-type contact region 8 is formed covering the bottom of the first contact trench 11a and is in contact with the $n^+$-type source region 7 and the $p^+$-type contact region 8a. At a position deeper than the $n^+$-type source region 22 and the $p^+$-type contact region 29, the $p^{++}$-type contact region 24 is formed covering the bottom of the second contact trench 27a and is in contact with the $n^+$-type source region 22 and the $p^+$-type contact region 29.

The $p^{++}$-type contact region 24 is formed by the ion implantation 68 at the bottom of the second contact trench 27a, whereby the $p^{++}$-type contact region 24 may be formed at a position deeper from the front surface of the semiconductor substrate 13. As a result, as described hereinafter, at the time of application of surge voltage to the Vcc terminal, absorption capability for an avalanche current 44 (refer to FIG. 1) spreading in the $p^-$-type well region 21 may be enhanced. Therefore, surge capability of the circuit region 42 may be enhanced.

The $p^{++}$-type contact regions 8, 24, 32 are formed by the ion implantation 68 at the bottoms of the first, the second, and the third contact trenches 11a, 27a, 33a, whereby at the bottoms of the first, the second, and the third contact trenches 11a, 27a, 33a or from the bottoms of the first, the second, and the third contact trenches 11a, 27a, 33a toward the rear surface of the semiconductor substrate 13, in the $p^{++}$-type contact regions 8, 24, 32, sites are present where impurity concentrations of the $p^{++}$-type contact regions 8, 24 is highest. The sites where the impurity concentrations of the $p^{++}$-type contact regions 8, 24, 32 are highest are determined by an accelerating voltage at the time of the ion implantation 68.

Further, although the first contact trench 11a and the $p^{++}$-type contact region 8 of the vertical MOSFET 10 for the output stage are formed having a same structure (trench contact structure) as that of the second contact trench 27a and the $p^{++}$-type contact region 24 of the lateral n-channel MOSFET 20 for the control circuit, electrical characteristics of the vertical MOSFET 10 are not adversely affected. In other words, the trench contact structure of the lateral n-channel MOSFET 20 for the control circuit is further suitable for the vertical MOSFET 10 for the output stage.

Figure 9:
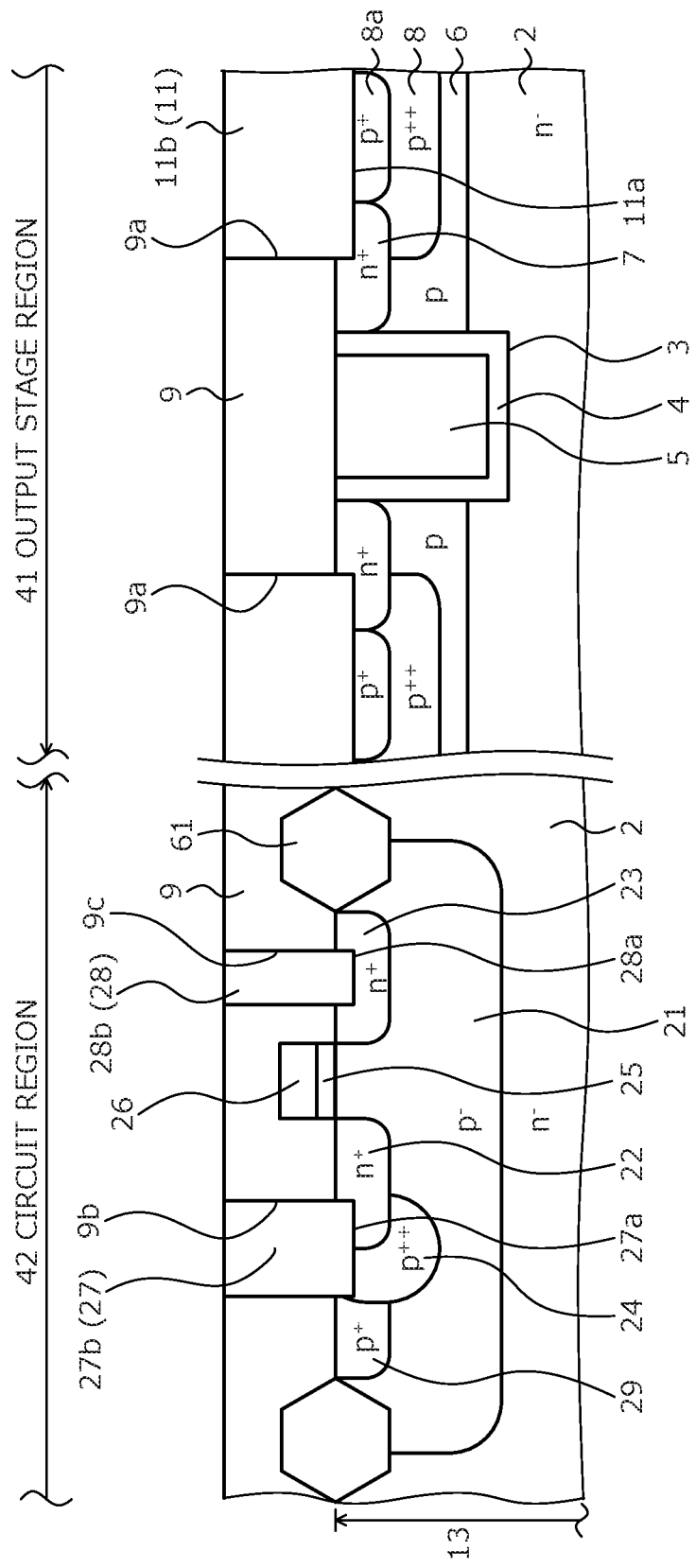
FIG. 9 is a cross-sectional view of the semiconductor device according to the first embodiment during manufacture.

Next, as depicted in FIG. 9, after the resist film 67 is removed, in the first, the second, and the third contact trenches 11a, 27a, 28a, the conductive films 11b, 27b, 28b are embedded, respectively. Next, on the front surface of the semiconductor substrate 13, the metal wiring layers 11c, 27c, 28c are formed respectively in contact with the conductive films 11b, 27b, 28b. On the rear surface of the semiconductor substrate 13, the drain electrode 12 is formed. Thereafter, the semiconductor wafer is diced into individual chips, completing the semiconductor device depicted in FIG. 1.

Operation of the semiconductor device according to the first embodiment will be described with reference to FIG. 1. When voltage between the Vcc terminal and the GND terminal increases and the voltage applied to the circuit region 42 increases due to surge voltage from the Vcc terminal, the vertical diode 30 for surge protection arranged near the outer periphery of the $p^-$-type well region 21 breaks down at a pn junction between the $p^+$-type diffusion region 31 and the $n^-$-type substrate region 2a, and current (avalanche current (hole current)) 44 is generated at a bottom (end toward the $n^+$-type starting substrate 1) of the $p^+$-type diffusion region 31. When the avalanche current 44 flowing through the circuit region 42 increases, a portion of the avalanche current 44 spreads, flowing to the $p^-$-type well region 21. This portion of the avalanche current 44 is lead out externally at a position deeper from the front surface of the semiconductor substrate 13 as compared to the conventional structure (FIG. 17) due to the $p^{++}$-type contact region 24 covering the bottom of the second contact trench 27a. Therefore, the avalanche current 44 is prevented from flowing to the $n^+$-type source region 22 of the lateral n-channel MOSFET 20. As a result, a parasitic bipolar element 43 constituted by the $n^+$-type source region 22 as an emitter, the $p^-$-type well region 21 as a base, and the $n^-$-type substrate region 2a as a collector becomes less likely to snapback, enabling the surge capability between the Vcc terminal and the GND terminal to be enhanced.

As described, according to the first embodiment, in the lateral n-channel MOSFET for the circuit having a periphery surrounded by the vertical diode for surge protection and arranged in the p⁻-type well region of the circuit region, the contact trench (second contact trench) is formed at the contact hole forming a contact with the source electrode and at an inner wall of the second contact trench, the contact of the source electrode and the n⁺-type source region and the p⁺⁺-type contact region is formed. Additionally, the p⁺⁺-type contact region covers the bottom of the second contact trench. As a result, the p⁺⁺-type contact region may be arranged at a position deeper than the front surface of the semiconductor substrate, thereby facilitating absorption of the avalanche current generated at the circuit region. As a result, a portion of the avalanche current generated at the circuit region becomes less likely to flow to the n⁺-type source region of the lateral n-channel MOSFET for the circuit and parasitic bipolar operation becomes less likely to occur at the circuit region. Therefore, the surge capability of the power IC overall may be enhanced.

Further, according to the first embodiment, a contact of an electrode film and a semiconductor part is formed at an inner wall of the contact trench, enabling the size of the unit cell to be reduced, whereby the size of the semiconductor device overall may be reduced. Further, according to the first embodiment, regions of similar conditions (diffusion regions having a same conductivity type, impurity concentration and diffusion depth, contact trenches) of the vertical MOSFET of the output stage and the lateral n-channel MOSFET for the circuit may be formed concurrently at a same step, whereby increases in manufacturing cost may be suppressed. Further, according to the first embodiment, a trench contact structure similar to that of the lateral n-channel MOSFET for the circuit may be employed in the vertical MOSFET for the output stage. In other words, even in the vertical MOSFET for the output stage, a contact of the source electrode and the n⁺-type source region and the p⁺⁺-type contact region is formed at an inner wall of the contact trench (first contact trench). As a result, the ON resistance of the vertical MOSFET for the output stage may be reduced.

Figure 10:
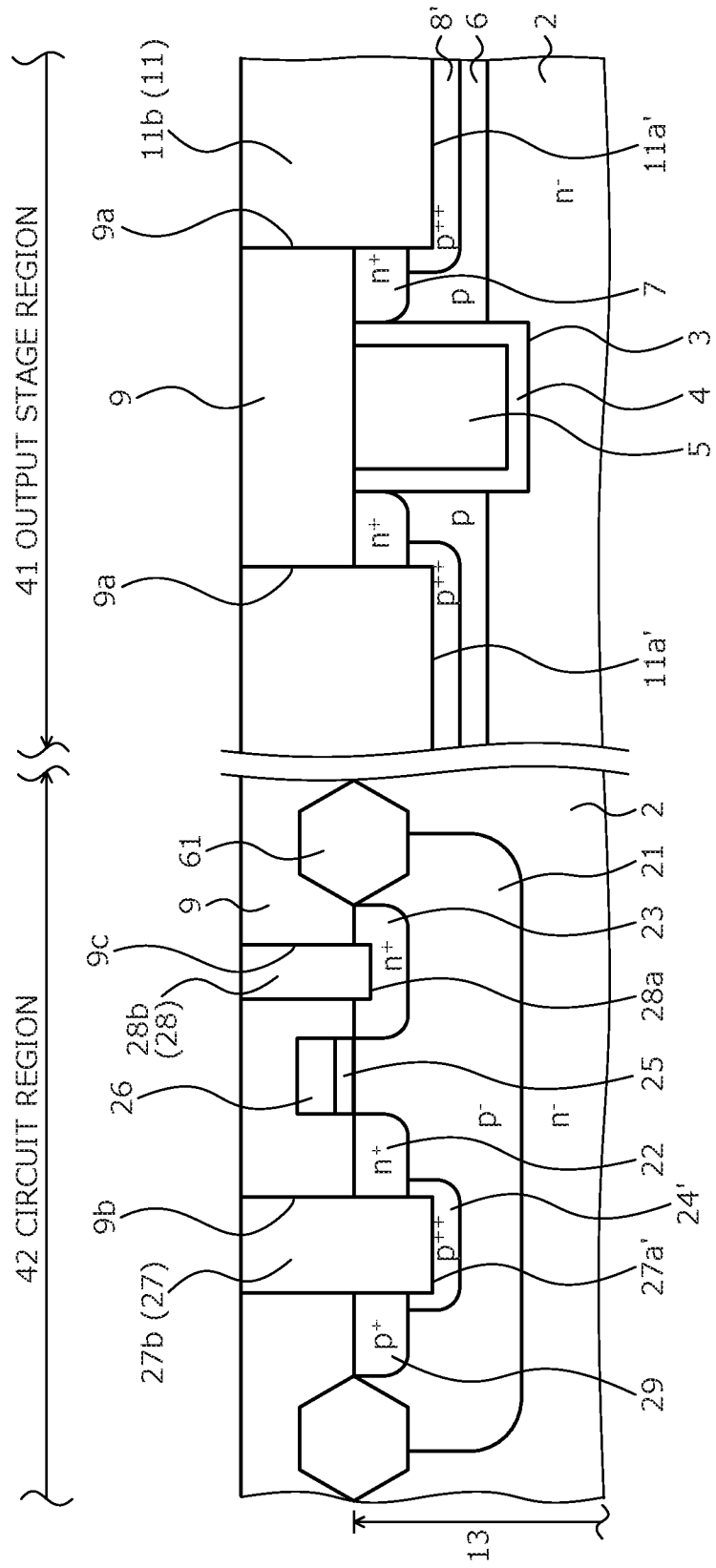
FIG. 10 is a cross-sectional view of a structure of the semiconductor device according to a second embodiment.

A structure of the semiconductor device according to a second embodiment will be described. FIG. 10 is a cross-sectional view of a structure of the semiconductor device according to the second embodiment. The semiconductor device according to the second embodiment differs from the semiconductor device according to the first embodiment in that depths of first and second contact trenches 11a', 27a' are respectively deeper than depths of the n⁺-type source regions 7, 22 of the vertical MOSFET 10 and the lateral n-channel MOSFET 20.

In the vertical MOSFET 10, a p⁺⁺-type contact region 8' covers an entire portion of the first contact trench 11a', the portion protruding from the n⁺-type source region 7, toward the n⁺-type starting substrate 1. The p⁺⁺-type contact region 8' may be in contact with the n⁺-type source region 7.

In the lateral n-channel MOSFET 20, a p⁺⁺-type contact region 24' covers an entire portion of the second contact trench 27a', the portion protruding from the n⁺-type source region 22 and the p⁺-type contact region 29, toward the n⁺-type starting substrate 1. The p⁺⁺-type contact region 24' may be in contact with the n⁺-type source region 22 and the p⁺-type contact region 29.

The depths of the first and the second contact trenches 11a', 27a' may be to an extent that the p⁺⁺-type contact regions 8', 24' do not reach the n⁻-type substrate region 2a.

Figure 11:
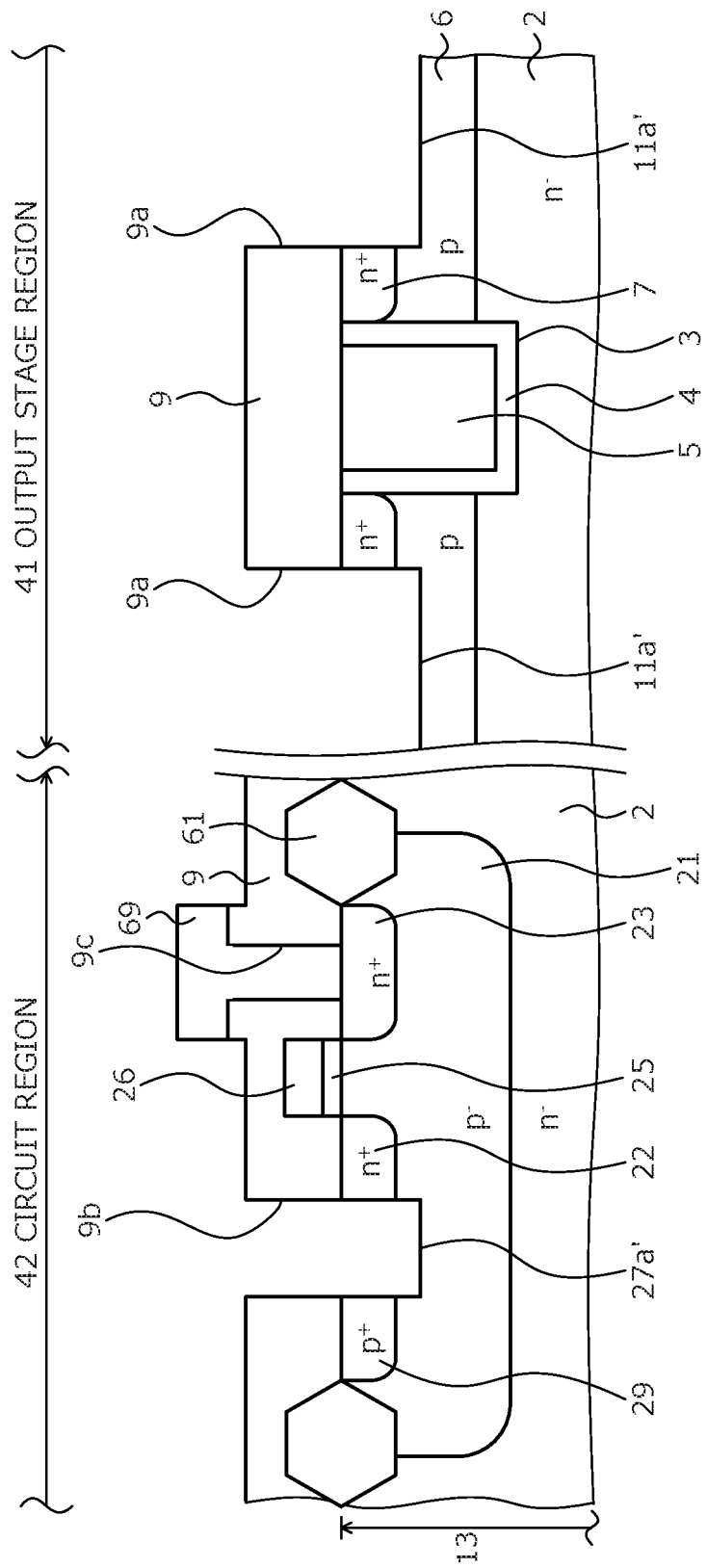
FIG. 11 is a cross-sectional view of the semiconductor device according to the second embodiment during manufacture.
Figure 12:
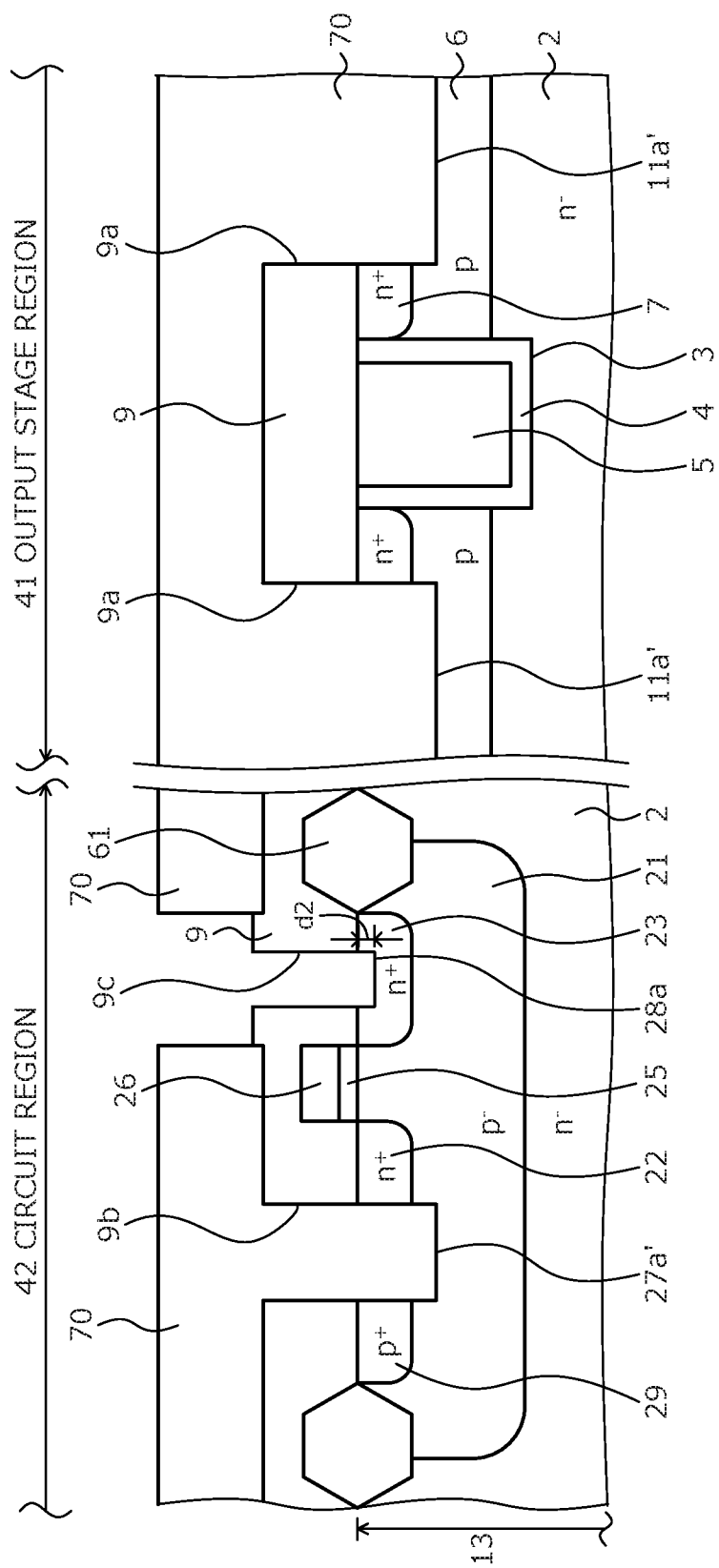
FIG. 12 is a cross-sectional view of the semiconductor device according to the second embodiment during manufacture.
Figure 13:
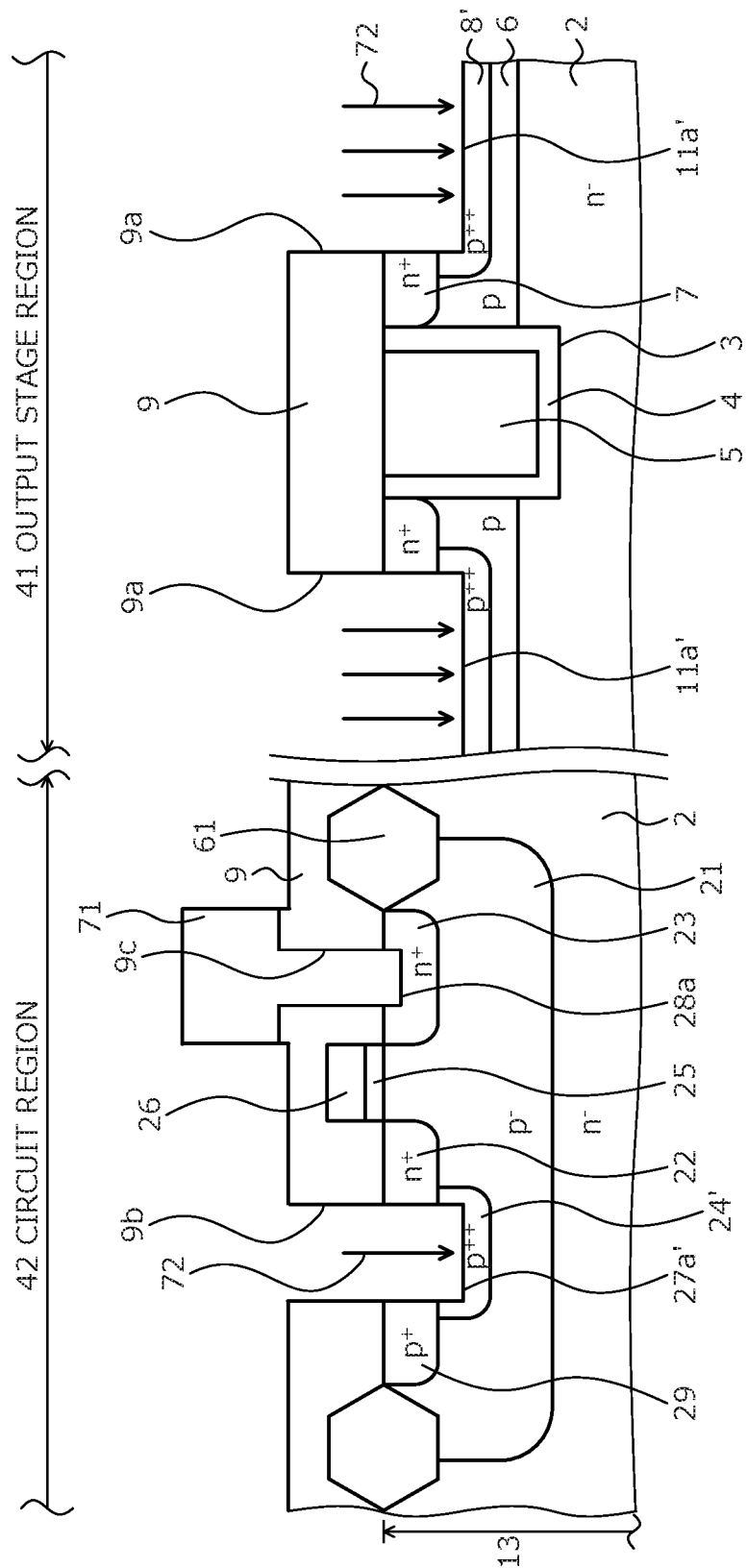
FIG. 13 is a cross-sectional view of the semiconductor device according to the second embodiment during manufacture.

A method of manufacturing the semiconductor device according to the second embodiment includes in the method of manufacturing the semiconductor device according to the first embodiment, forming the first and the second contact trenches 11a', 27a' by a process different from that for forming the third contact trench 28a. At this time, the depths of the first and the second contact trenches 11a', 27a' are deeper than the depth of the third contact trench 28a. In particular, the method of manufacturing the semiconductor device according to the second embodiment is as follows. FIGS. 11, 12, and 13 are cross-sectional views of the semiconductor device according to the second embodiment during manufacture.

First, similarly to the first embodiment, processes from formation of the p-type base region 6 and the p⁻-type well region 21 with respect to the semiconductor substrate (semiconductor wafer) 13 to formation of the first to the third contact holes 9a to 9c in the interlayer insulating film 9 are performed sequentially (refer to FIGS. 3 to 6). Formation of the p⁺-type contact region 8a may be omitted. In this case, in FIG. 5, openings of the resist film 64 are only formed in the circuit region 42.

Next, as depicted in FIG. 11, after the resist film 66 is removed, a resist film 69 is embedded in the third contact hole 9c, whereby a portion (the n⁺-type drain region 23) of the front surface of the semiconductor substrate 13 exposed at the third contact hole 9c is covered by the resist film 69. Portions (the n⁺-type source regions 7, 22 and the p⁺-type contact regions 8a, 29) of the front surface of the semiconductor substrate 13 exposed at the first and the second contact holes 9a, 9b are exposed at openings of the resist film 69.

Next, etching is performed using the resist film 69 and the interlayer insulating film 9 as masks, whereby at the portions of the front surface of the semiconductor substrate 13 exposed at the first and the second contact holes 9a, 9b, the first and the second contact trenches 11a', 27a' are formed respectively. At this time, the first and the second contact trenches 11a', 27a' respectively are formed deeper than the n⁺-type source regions 7, 22 and penetrate the n⁺-type source regions 7, 22 in the depth direction Z. Bottoms of the first and the second contact trenches 11a', 27a' terminate in the p-type base region 6 and the p⁻-type well region 21, respectively. At the time of formation of the first and the second contact trenches 11a', 27a', the interlayer insulating film 9 is also etched at the portions exposed at the openings of the resist film 69, and a thickness of the interlayer insulating film 9 becomes thinner by the etched portions.

Next, as depicted in FIG. 12, after the resist film 69 is removed, a resist film 70 is embedded in the first and the second contact holes 9a, 9b and in the first and the second contact trenches 11a', 27a', whereby portions (the n⁺-type source regions 7, 22 and the p⁺-type contact regions 8a, 29) of the front surface of the semiconductor substrate 13 exposed at the first and the second contact holes 9a, 9b are covered by the resist film 70. A portion of the front surface of the semiconductor substrate 13 exposed at the third contact hole 9c is exposed at an opening of the resist film 69.

Next, etching is performed using the resist film 70 and the interlayer insulating film 9 as masks, whereby the third contact trench 28a is formed at the portion of the front surface of the semiconductor substrate 13 exposed at the third contact hole 9c, similarly to the first embodiment. In other words, the third contact trench 28a is formed at the depth d2 that is shallower than the depth of the n⁺-type drain region 23 and the bottom of the third contact trench 28a terminates in the n⁺-type drain region 23. At the time of formation of the third contact trench 28a, the interlayer insulating film 9 is also etched at the portion exposed at the opening of the resist film 70 and the thickness of the interlayer insulating film 9 becomes thinner by the etched portion. A sequence in which the third contact trench 28a, and the first and the second contact trenches 11a', 27a' are formed may be interchanged.

Next, as depicted in FIG. 13, after the resist film 70 is removed, a resist film 71 is embedded in the third contact trench 28a, whereby the third contact trench 28a is covered by the resist film 71. A portion (the n$^+$-type drain region 23) of the front surface of the semiconductor substrate 13 exposed at the third contact trench 28a is covered by the resist film 71. Portions (the n$^+$-type source regions 7, 22 and the p$^+$-type contact regions 8a, 29) of the front surface of the semiconductor substrate 13 exposed at the first and the second contact trenches 11a', 27a' are exposed at openings of the resist film 71.

Next, an ion implantation 72 of a p-type impurity is performed at the bottoms of the first and the second contact trenches 11a', 27a', using the resist film 71 and the interlayer insulating film 9 as masks. As a result, at a position deeper from the front surface of the semiconductor substrate 13 than that in the first embodiment, the p$^{++}$-type contact region 8' is formed covering the bottom of the first contact trench 11a'. At a position deeper from the front surface of the semiconductor substrate 13 than that in the first embodiment, the p$^{++}$-type contact region 24' is formed covering the bottom of the second contact trench 27a'. The p$^{++}$-type contact regions 8', 24' may be in contact with the n$^+$-type source regions 7, 22, respectively.

Next, after the resist film 71 is removed, similarly to the first embodiment, the conductive films 11b, 27b, 28b are embedded in the first, the second, and the third contact trenches 11a', 27a', 28a, respectively. Thereafter, similarly to the first embodiment, the process of forming the metal wiring layers 11c, 27c, 28c and subsequent processes are sequentially performed, whereby the semiconductor device depicted in FIG. 10 is completed.

In FIGS. 11 to 13, although the p$^+$-type diffusion region 31, the p$^{++}$-type contact region 32, the fourth contact trench 33a, and the conductive film 33b are not depicted, the p$^+$-type diffusion region 31, for example, is formed by ion implantation between formation of the p$^-$-type well region 21 and formation of the p$^{++}$-type contact region 32. The p$^{++}$-type contact region 32, the fourth contact trench 33a, and the conductive film 33b are respectively formed concurrently with the p$^{++}$-type contact region 24', the second contact trench 27a', and the conductive film 27b of the lateral n-channel MOSFET 20.

As described, according to the second embodiment, effects similar to those of the first embodiment may be obtained. Further, according to the second embodiment, the second contact trench is formed deeper than the depth of the n$^+$-type source region of the lateral n-channel MOSFET for the control circuit, whereby absorption capability of current (surge current (i.e., avalanche current)) flowing due to surge voltage may be enhanced.

Figure 14:
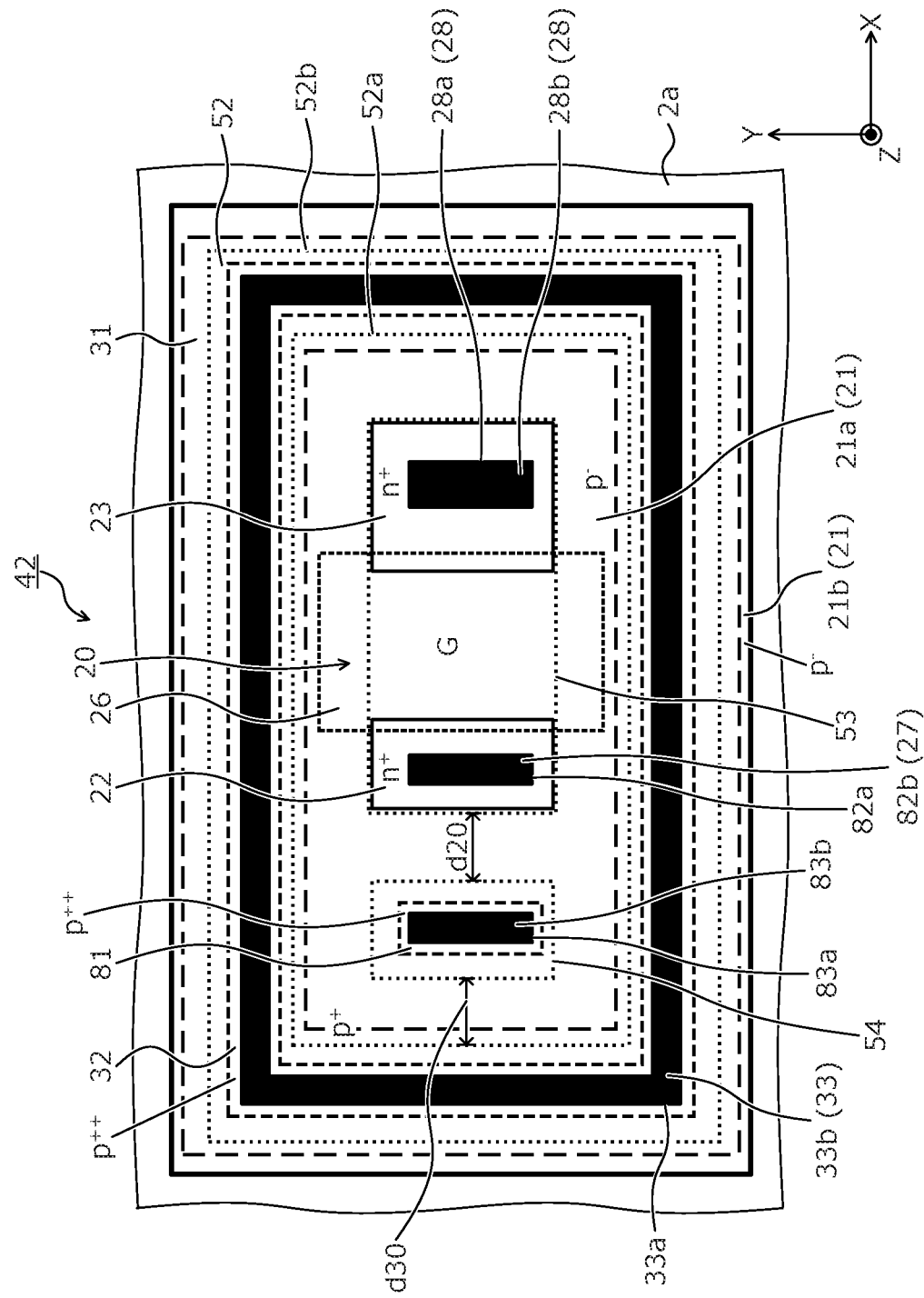
FIG. 14 is a plan view depicting a layout of the semiconductor device according to a third embodiment, as viewed from the front surface side of the semiconductor substrate.

A structure of the semiconductor device according to a third embodiment will be described. FIG. 14 is a plan view depicting a layout of the semiconductor device according to the third embodiment, as viewed from the front surface side of the semiconductor substrate. FIG. 14 depicts a layout of the circuit region 42, as viewed from the front surface side of the semiconductor substrate 13. The semiconductor device according to the third embodiment differs from the semiconductor device according to the first embodiment in that a p$^{++}$-type contact region 81 is provide in place of the p$^{++}$-type contact region 24 of the lateral n-channel MOSFET 20. The p$^{++}$-type contact region 81 is arranged separated from the n$^+$-type source region 22.

The p$^{++}$-type contact region 81, similarly in the first embodiment, is arranged at the first side of the n$^+$-type source region 22 opposite the second side thereof toward the n$^+$-type drain region 23. The n$^+$-type source region 22, the n$^+$-type drain region 23, the p$^{++}$-type contact region 81, and the gate electrode 26 of the lateral n-channel MOSFET 20, for example, are arranged in a striped shape extending along a same direction parallel to the front surface of the semiconductor substrate 13.

A second, the third, and a fifth contact trenches 82a, 28a, 83a are arranged in the n$^+$-type source region 22, the n$^+$-type drain region 23, and the p$^{++}$-type contact region 81, respectively. A configuration of the conductive film 28b embedded in the third contact trench 28a and the third contact trench 28a is similar to that in the first embodiment.

The second contact trench 82a has a substantially rectangular planar shape. The second contact trench 82a is arranged only in the n$^+$-type source region 22 and the n$^+$-type source region 22 covers the second contact trench 82a entirely. A structure of the second contact trench 82a cross-sectionally, for example, is similar to the third contact trench 28a formed in only the n$^+$-type drain region 23 (refer to FIGS. 1, 2).

The fifth contact trench 83a has, for example, a rectangular planar shape. The p$^{++}$-type contact region 81 covers a bottom of the fifth contact trench 83a. The p$^{++}$-type contact region 81 may cover the bottom of the fifth contact trench 83a, spanning across a bottom corner part thereof. As necessary, the p$^+$-type contact region 29 described in the first embodiment may be arranged at a periphery of the fifth contact trench 83a so as to cover a side of the fifth contact trench 83a and be in contact with the p$^{++}$-type contact region 81. A structure of the fifth contact trench 83a cross-sectionally is similar to that of the second contact trench 27a in the first embodiment (refer to FIGS. 1, 2).

Conductive films 82b, 83b are embedded in the second and the fifth contact trenches 82a, 83a, respectively. The conductive films 82b, 83b are electrically connected to GND terminal, via the metal wiring layer. In an active region (first active region) 53 of the lateral n-channel MOSFET 20, the n$^+$-type source region 22, the n$^+$-type drain region 23, and the gate electrode 26 are arranged.

An active region (hereinafter, third active region) 54 in which the fifth contact trench 83a is arranged, is arranged separated from the first and the second active regions 53, 52. A distance d20 between the third active region 54 and the first active region 53 may be reduced to the smallest dimension that may be left of a LOCOS film due to constraints of processing precision. A minimum distance d30 between the third active region 54 and the second active region 52 along the first direction X may be reduced to a distance that is at least the smallest dimension that may be left of a LOCOS film due to constraints of processing precision and that does not allow the p$^+$-type diffusion region 31 surrounding the second active region 52 to enter a portion in the first active region 51, covered by the gate electrode 26.

Configuration of the p$^+$-type diffusion region 31, the p$^{++}$-type contact region 32, the fourth contact trench 33a, and the conductive film 33b of the vertical diode 30 for surge protection is similar to that in the first embodiment.

The third embodiment may be applied to the second embodiment.

As described, according to the third embodiment, effects similar to those of the first and the second embodiments may be obtained. Further, according to the third embodiment, the p$^{++}$-type contact region of the lateral n-channel MOSFET for the control circuit is arranged separated from the n$^+$-type source region, whereby during manufacturing processes, diffusion of a p-type impurity from the $p^{++}$-type contact region to the $n^+$-type source region is suppressed. Therefore, for example, when an impurity concentration of the $p^{++}$-type contact region is higher than an impurity concentration of the $n^+$-type source region, disappearance of the $n^+$-type source region may be suppressed.

Figure 15:
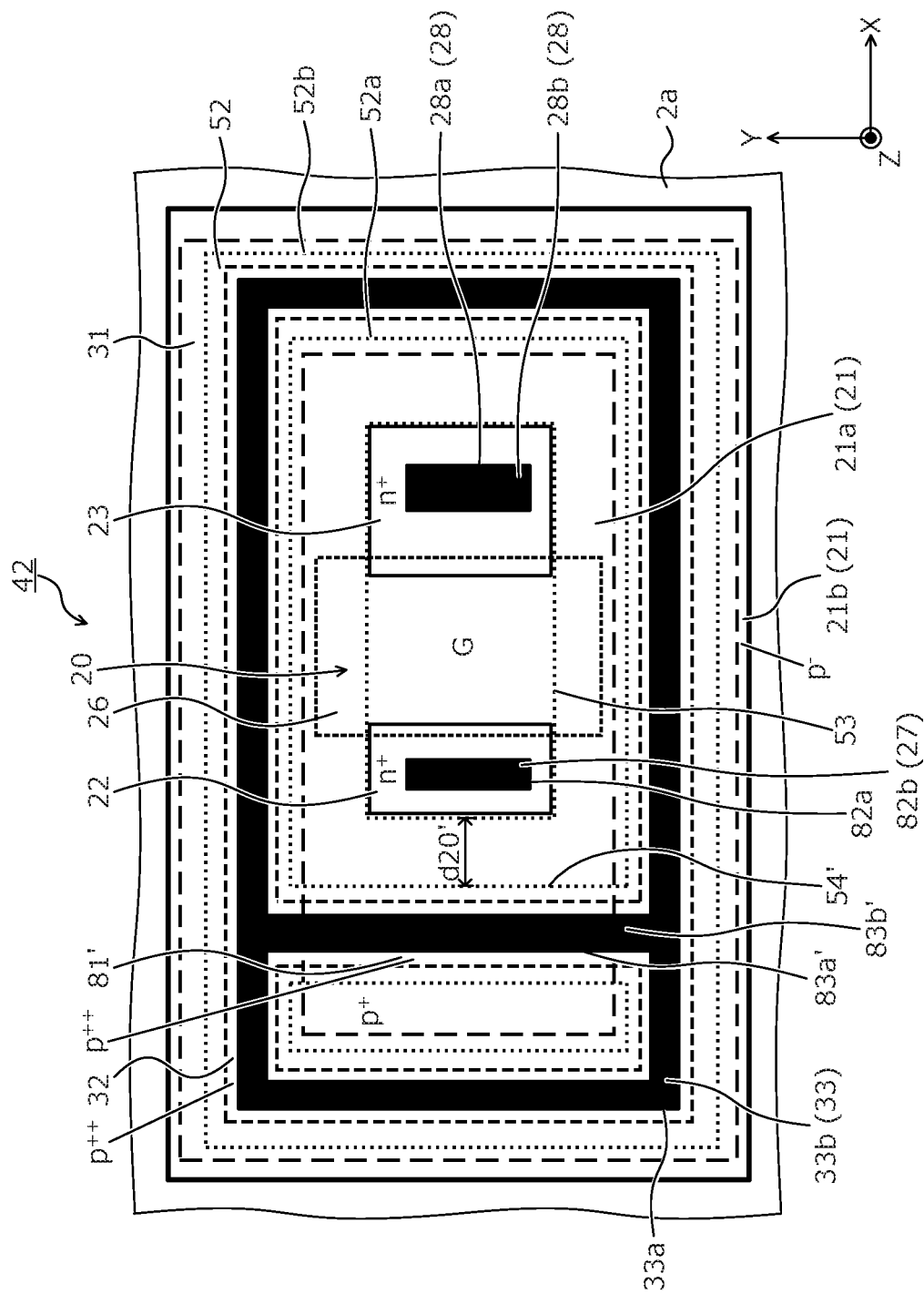
FIG. 15 is a plan view depicting a layout of the semiconductor device according to a fourth embodiment, as viewed from the front surface side of the semiconductor substrate.

A structure of the semiconductor device according to a fourth embodiment will be described. FIG. 15 is a plan view depicting a layout of the semiconductor device according to the fourth embodiment, as viewed from the front surface side of the semiconductor substrate. FIG. 15 depicts a layout of the circuit region 42, as viewed from the front surface side of the semiconductor substrate 13. The semiconductor device according to the fourth embodiment differs from the semiconductor device according to the third embodiment in that a $p^{++}$-type contact region 81' of the lateral n-channel MOSFET 20 is connected to the $p^{++}$-type contact region 32 that is in the $p^+$-type diffusion region 31 and functions as a guard ring.

The $p^{++}$-type contact region 81' extends linearly, for example, along the second direction Y and is connected to a pair of opposing sides of the $p^{++}$-type contact region 32, the opposing sides of the $p^{++}$-type contact region 32 being orthogonal to the $p^{++}$-type contact region 81'. A fifth contact trench 83a' is arranged in a linear layout parallel to the $p^{++}$-type contact region 81' and is connected to the fourth contact trench 33a.

The $p^{++}$-type contact region 81' covers a bottom of the fifth contact trench 83a'. The $p^{++}$-type contact region 81' may cover the bottom of the fifth contact trench 83a', spanning across a bottom corner part thereof. A structure of the fifth contact trench 83a' cross-sectionally is similar to that of the second contact trench 27a in the first embodiment (refer to FIGS. 1, 2). As necessary, the $p^+$-type contact region 29 described in the first embodiment may be arranged so as to cover, along the second direction Y, both sides of the fifth contact trench 83a' and be in contact with the $p^{++}$-type contact region 81'.

An active region (third active region) 54' in which the fifth contact trench 83a' is arranged, is connected to the second active region 52. A distance d20' between the third active region 54' and the first active region 53 may be reduced to at least the smallest dimension that may be left of a LOCOS film due to constraints of processing precision.

The fourth embodiment may be applied to the second embodiment.

As described, according to the fourth embodiment, effects similar to those of the first to the third embodiments may be obtained. Further, according to the fourth embodiment, the $p^{++}$-type contact region of the lateral n-channel MOSFET for the control circuit is arranged in a linear planar shape, whereby a mathematical area of the $p^{++}$-type contact region may be increased without increasing a width of the $p^{++}$-type contact region along a first direction. Therefore, surge capability may be further enhanced. Further, according to the fourth embodiment, since the width of the $p^{++}$-type contact region along the first direction does not increase, diffusion of the $p^{++}$-type contact region along the first direction during manufacturing processes is suppressed. As a result, the distance between the first and the third active regions may be reduced, enabling reductions in the size of the chip to be facilitated.

Figure 16:
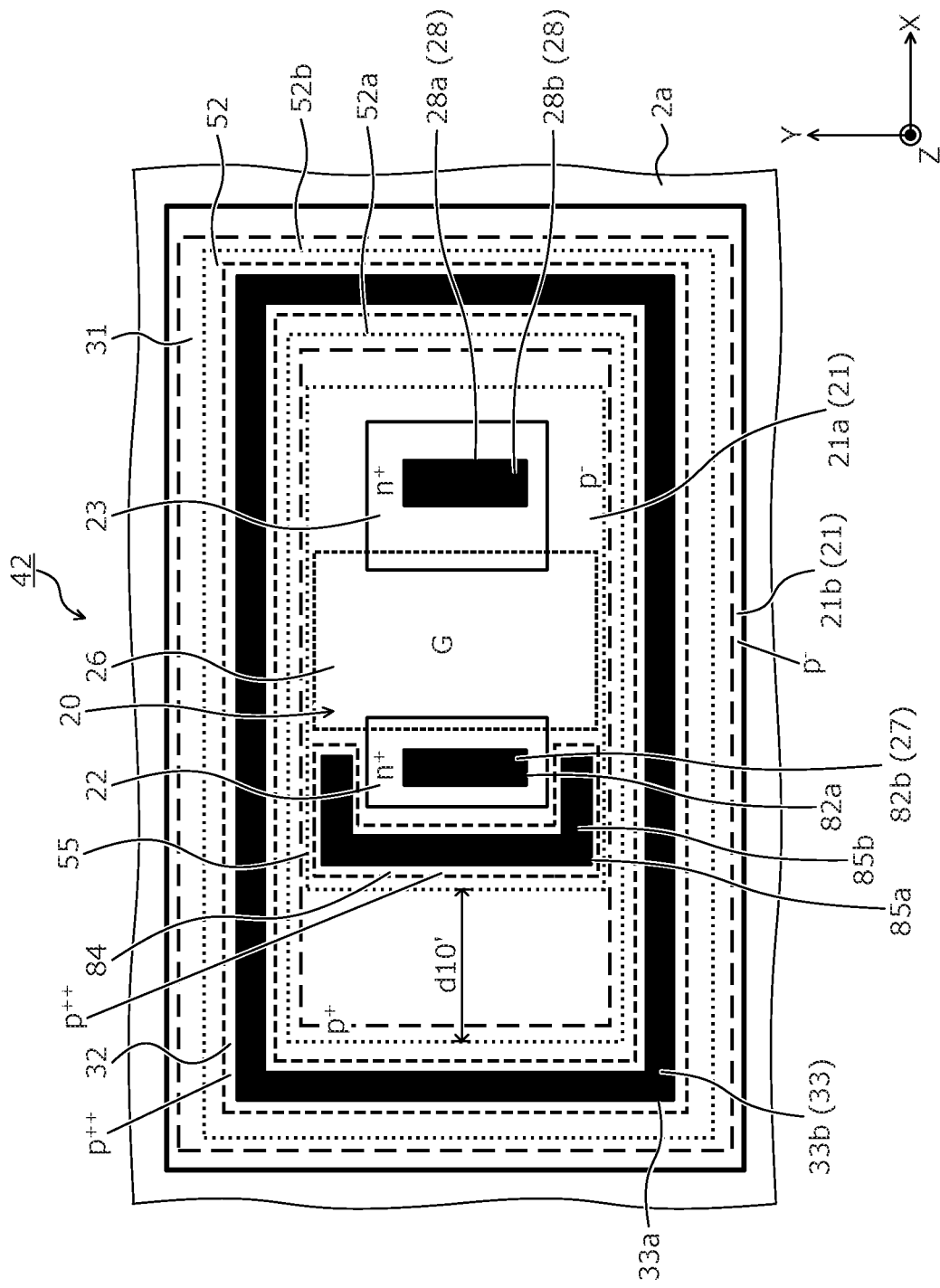
FIG. 16 is a plan view depicting a layout of semiconductor device according to a fifth embodiment, as viewed from the front surface side of the semiconductor substrate.

A structure of the semiconductor device according to a fifth embodiment will be described. FIG. 16 is a plan view depicting a layout of semiconductor device according to the fifth embodiment, as viewed from the front surface side of the semiconductor substrate. FIG. 16 depicts a layout of the circuit region 42, as viewed the front surface side of the semiconductor substrate 13. The semiconductor device according to the fifth embodiment differs from the semiconductor device according to the third embodiment in that a $p^{++}$-type contact region 84 of the lateral n-channel MOSFET 20 is arranged in a substantially U-shaped planar shape surrounding a periphery of the $n^+$-type source region 22 so as to oppose three sides of the $n^+$-type source region 22 having a substantially rectangular planar shape.

A fifth contact trench 85a opposes the three sides of the $n^+$-type source region 22, in a substantially U-shape planar shape along the $p^{++}$-type contact region 84. The $p^{++}$-type contact region 84 covers a bottom of the fifth contact trench 85a. The $p^{++}$-type contact region 84 may cover the bottom of the fifth contact trench 85a, spanning across a bottom corner part thereof. A structure of the fifth contact trench 85a cross-sectionally is similar to that of the second contact trench 27a in the first embodiment (refer to FIGS. 1, 2).

As necessary, the $p^+$-type contact region 29 described in the first embodiment may be arranged in a periphery of the fifth contact trench 85a so as to cover a side of the fifth contact trench 85a and be in contact with the $p^{++}$-type contact region 84. A distance d10' between a first active region 55 and the second active region 52 may be reduced to a distance that is at least the smallest dimension that may be left of a LOCOS film due to constraints of processing precision and that does not allow the $p^+$-type diffusion region 31 surrounding the second active region 52 to enter a portion in the first active region 55, covered by the gate electrode 26.

The fifth embodiment may be applied to the second embodiment.

As described, according to the fifth embodiment, the $p^{++}$-type contact region of the lateral n-channel MOSFET for the control circuit is arranged only in the first active region, at the first side of the $n^+$-type source region opposite the second side thereof toward the $n^+$-type drain region 23 and effects similar to those of the first to the fourth embodiments may be obtained irrespective of the planar shape of the $p^{++}$-type contact region.

In the embodiments of the present invention, without limitation hereto, various changes within a range not departing from the spirit of the invention are possible. For example, in the embodiments, although a case is described in which a vertical MOSFET having a trench gate structure is provided as a semiconductor element of the output stage, various devices may be provided as a semiconductor element of the output stage, such as a vertical insulated gate bipolar transistor (IGBT) having a trench gate structure or a vertical MOSFET, IGBT or the like having a planar gate structure. In the case of a vertical IGBT, for example, in place of the $n^+$-type starting substrate 1, a $p^+$-type starting substrate is used and at a rear surface of the $p^+$-type starting substrate, an electrode may be formed. Further, the present invention is applicable to a semiconductor device having on a single semiconductor substrate, various devices (elements) constituting a circuit region and a protection element that protects these devices from surges. Further, the present invention is similarly implemented when the conductivity types (n-type, p-type) are reversed.

According to the embodiments of the present invention, the $p^{++}$-type contact region (seventh semiconductor region) may be arranged at a position deeper than the front surface of the semiconductor substrate and therefore, absorption of avalanche current generated at the circuit region is facilitated. As a result, a part of the avalanche current generated at the circuit region becomes less likely to flow to the n+-type source region (fifth semiconductor region) of the second element, whereby parasitic bipolar operation at the circuit region becomes less likely to occur.

The semiconductor device and the method of manufacturing a semiconductor device according to embodiments of the present invention achieve an effect in that in a semiconductor device having on a single semiconductor substrate, a main circuit region (output stage region) and a circuit region that controls the main circuit region, the surge capability of the circuit region may be enhanced and electrical characteristics of the main circuit region may be enhanced.

As described, the semiconductor device and the method of manufacturing a semiconductor device according to the embodiments of the present invention are suitable for a semiconductor device in which an output stage and a circuit region are arranged on a single semiconductor substrate, the semiconductor device including a protection diode that protects a device constituting the circuit region, from surges in a same p−-type well region as the device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate;
   a first element provided in the semiconductor substrate, the first element including:
      a first semiconductor region of a second conductivity type selectively provided in a surface layer at a first main surface of the semiconductor substrate of a first conductivity type;
      a second semiconductor region of the first conductivity type selectively provided in the first semiconductor region;
      a third semiconductor region of the second conductivity type selectively provided in the first semiconductor region, the third semiconductor region having an impurity concentration higher than an impurity concentration of the first semiconductor region;
      a semiconductor layer of the first conductivity type provided closer to a second main surface of the semiconductor substrate than is the first semiconductor region, the semiconductor layer being in contact with the first semiconductor region;
      a first gate insulating film provided in contact with a region of the first semiconductor region between the second semiconductor region and the semiconductor layer;
      a first gate electrode opposing the first semiconductor region, across the first gate insulating film;
      a first trench in the first element, spanning the second semiconductor region and the third semiconductor region, the first trench provided at a first depth measured from the first main surface of the semiconductor substrate;
      a first electrode embedded in the first trench and electrically connected to the second semiconductor region and the third semiconductor region; and
      a second electrode provided at the second main surface of the semiconductor substrate and electrically connected to the semiconductor substrate;
   a second element provided in the semiconductor substrate, the second element including:
      a fourth semiconductor region of the second conductivity type selectively provided in said surface layer, the fourth semiconductor region being separated from the first semiconductor region;
      a fifth semiconductor region of the first conductivity type selectively provided in the fourth semiconductor region;
      a sixth semiconductor region of the first conductivity type selectively provided in the fourth semiconductor region, the sixth semiconductor region being separated from the fifth semiconductor region;
      a seventh semiconductor region of the second conductivity type selectively provided in the fourth semiconductor region, the seventh semiconductor region having an impurity concentration that is higher than an impurity concentration of the fourth semiconductor region and is highest at a predetermined depth below the first main surface of the semiconductor substrate;
      a second gate insulating film provided in contact with a region of the fourth semiconductor region between the fifth semiconductor region and the sixth semiconductor region;
      a second gate electrode opposing the fourth semiconductor region, across the second gate insulating film;
      a second trench spanning the fifth semiconductor region and the seventh semiconductor region, the second trench provided at a second depth from the first main surface of the semiconductor substrate, the seventh semiconductor region covering a bottom of the second trench;
      a third trench provided in the sixth semiconductor region, at a third depth below the first main surface of the semiconductor substrate, the third depth being shallower than a depth of the sixth semiconductor region;
      a third electrode embedded in the second trench and electrically connected to the fifth semiconductor region and the seventh semiconductor region; and
      a fourth electrode embedded in the third trench and electrically connected to the sixth semiconductor region; and
   an eighth semiconductor region of the second conductivity type selectively provided in the fourth semiconductor region, the eighth semiconductor region being separated from the second element, the eighth semiconductor region penetrating the fourth semiconductor region from the first main surface of the semiconductor substrate and reaching the semiconductor layer, the eighth semiconductor region having an impurity concentration higher than the impurity concentration of the fourth semiconductor region.

2. The semiconductor device according to claim 1, wherein the second depth of the second trench is shallower than a depth of the fifth semiconductor region.

3. The semiconductor device according to claim 1, wherein the second depth of the second trench is deeper than a depth of the fifth semiconductor region.

4. The semiconductor device according to claim 1, further comprising
   a ninth semiconductor region of the second conductivity type selectively provided in the fourth semiconductor region, the ninth semiconductor region covering at least a part of a first inner wall of the second trench opposite a second inner wall of the second trench with respect to the fifth semiconductor region, the ninth semiconductor region having an impurity concentration higher than the impurity concentration of the fourth semiconductor region.

5. The semiconductor device according to claim 4, wherein the seventh semiconductor region is in contact with the ninth semiconductor region.

6. The semiconductor device according to claim 1, wherein the seventh semiconductor region is in contact with the fifth semiconductor region.

7. The semiconductor device according to claim 1, wherein the seventh semiconductor region has a circular or an elliptical cross-sectional shape formed by an impurity of the second conductivity type diffusing in a radial shape in the fourth semiconductor region from the bottom of the second trench.

8. The semiconductor device according to claim 1, wherein the seventh semiconductor region opposes the sixth semiconductor region, across the fifth semiconductor region.

9. The semiconductor device according to claim 1, wherein the third trench is entirely disposed in the sixth semiconductor region.

10. The semiconductor device according to claim 1, wherein the first depth of the first trench is shallower than a depth of the second semiconductor region.

11. The semiconductor device according to claim 1, wherein the first trench penetrates the second semiconductor region and reaches the first semiconductor region.

12. The semiconductor device according to claim 1, wherein the third semiconductor region is in contact with the second semiconductor region.

13. The semiconductor device according to claim 1, wherein the third semiconductor region has a circular or an elliptical cross-sectional shape formed by an impurity of the second conductivity type diffusing in a radial shape in the first semiconductor region from a bottom of the first trench.

14. The semiconductor device according to claim 1, wherein the eighth semiconductor region is provided along an outer periphery of the fourth semiconductor region and surrounds a periphery of the second element.

* * * * *